(12) United States Patent
Lin

(10) Patent No.: US 12,309,003 B2
(45) Date of Patent: May 20, 2025

(54) DATA RECEIVING CIRCUIT, DATA RECEIVING SYSTEM, AND STORAGE APPARATUS

(71) Applicant: Changxin Memory Technologies, Inc., Anhui (CN)

(72) Inventor: Feng Lin, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 42 days.

(21) Appl. No.: 18/232,489

(22) Filed: Aug. 10, 2023

(65) Prior Publication Data

US 2024/0097946 A1    Mar. 21, 2024

Related U.S. Application Data

(63) Continuation of application No. PCT/CN2022/128993, filed on Nov. 1, 2022.

(30) Foreign Application Priority Data

Sep. 15, 2022    (CN) .......................... 202211124797.7

(51) Int. Cl.
     *H04L 25/03*      (2006.01)
     *H04B 1/16*      (2006.01)

(52) U.S. Cl.
     CPC ......... *H04L 25/03057* (2013.01); *H04B 1/16* (2013.01); *H04L 2025/03789* (2013.01)

(58) Field of Classification Search
     CPC ........... H04L 25/03057; H04L 25/0292; H04L 25/0272; H04L 2025/03789;

(Continued)

(56) References Cited

U.S. PATENT DOCUMENTS

2008/0089155 A1*   4/2008   Bae ....................... G11C 7/1078
                                                             365/205
2015/0188693 A1*   7/2015   Giaconi ................ H04L 7/0331
                                                             375/373

(Continued)

FOREIGN PATENT DOCUMENTS

| CN | 109302147 A | 2/2019 |
|---|---|---|
| CN | 113129987 A | 7/2021 |
| CN | 113556104 A | 10/2021 |

OTHER PUBLICATIONS

PCT International Search Report and the Written Opinion mailed Apr. 20, 2023, issued in related International Application No. PCT/CN2022/128993, with partial English machine translation (9 pages).

*Primary Examiner* — Aristocratis Fotakis
(74) *Attorney, Agent, or Firm* — Sheppard Mullin Richter & Hampton LLP

(57) ABSTRACT

A data receiving circuit includes a decision feedback equalization circuit, configured to perform decision feedback equalization on a receive circuit based on a feedback signal to adjust a first output signal and a second output signal, where the feedback signal is obtained based on previously received data, the decision feedback equalization circuit responds to a first control signal group and a second control signal group to change an adjustment capability, the first control signal group corresponds to one data port corresponding to a data signal, and the second control signal group corresponds to all data ports. The capability of the decision feedback equalization circuit can be controlled to adjust the first output signal and the second output signal, where the adjustment capability has a wide adjustable range, to reduce impact of intersymbol interference of received data on the data receiving circuit.

19 Claims, 9 Drawing Sheets

(58) Field of Classification Search
CPC ... H04L 25/03267; H04B 1/16; G11C 7/1063; H03F 1/0205
See application file for complete search history.

(56) References Cited

U.S. PATENT DOCUMENTS

| | | |
|---|---|---|
| 2021/0080994 A1* | 3/2021 | Takada .................. H03L 7/0807 |
| 2021/0184726 A1* | 6/2021 | Shiroshita ................ H04B 3/10 |
| 2021/0288846 A1 | 9/2021 | Yi et al. |
| 2022/0123973 A1* | 4/2022 | Kim .................. H04L 25/03866 |
| 2022/0141054 A1 | 5/2022 | Seong et al. |
| 2023/0008644 A1* | 1/2023 | Gu ......................... H03K 5/249 |
| 2024/0163137 A1* | 5/2024 | Isakanian ............... H03K 5/249 |

* cited by examiner

DATA RECEIVING CIRCUIT, DATA RECEIVING SYSTEM, AND STORAGE APPARATUS

CROSS-REFERENCE TO RELATED APPLICATIONS

This application is a continuation application of International Patent Application No. PCT/CN2022/128993, filed on Nov. 1, 2022, which claims priority to Chinese Patent Application No. 202211124797.7, filed on Sep. 15, 2022 and entitled "DATA RECEIVING CIRCUIT, DATA RECEIVING SYSTEM, AND STORAGE APPARATUS". The above-referenced applications are incorporated herein by reference in their entirety.

TECHNICAL FIELD

Some embodiments of the present invention relate to the field of semiconductor technologies, and in particular, to a data receiving circuit, a data receiving system, and a storage apparatus.

BACKGROUND

In memory applications, as the signal transmission rate becomes higher, the impact of channel loss on signal quality becomes greater, easily causing inter-symbol interference. Currently, a channel is usually compensated using an equalization circuit. The equalization circuit may be a continuous time linear equalizer (CTLE) or a decision feedback equalizer (DFE).

However, the current equalization circuits have limited capability to adjust the signal, and accuracy of signal adjustment by the equalization circuit needs to be improved.

SUMMARY

Some embodiments of the present invention provide a data receiving circuit, a data receiving system, and a storage apparatus, so as to at least flexibly control a capability of a decision feedback equalization circuit to adjust a first output signal and a second output signal, and reduce impact of inter-symbol interference of data received by the data receiving circuit on the data receiving circuit, thereby improving receiving performance of the data receiving circuit.

According to some embodiments of the present invention, a first aspect of the embodiments of the present invention provides a data receiving circuit, including: a receive circuit, configured to receive a reference signal and a data signal from data ports, compare the data signal with the reference signal in response to a sampling clock signal, and output a first output signal and a second output signal; and a decision feedback equalization circuit, connected to a feedback node of the receive circuit and configured to perform decision feedback equalization on the receive circuit based on a feedback signal to adjust the first output signal and the second output signal, where the feedback signal is obtained based on previously received data, the decision feedback equalization circuit responds to a first control signal group and a second control signal group to adjust a capability to adjust the first output signal and the second output signal, the first control signal group corresponds to one of the data ports corresponding to the data signal, and the second control signal group corresponds to all of the data ports.

In some embodiments, the decision feedback equalization circuit includes: a first adjustment circuit, configured to adjust an equivalent resistance value of the first adjustment circuit in response to a first encoded signal group, where the equivalent resistance value of the first adjustment circuit is denoted as a first resistance value, and the first encoded signal group is obtained by performing first compilation on the first control signal group and/or the second control signal group; and a second adjustment circuit, connected in parallel to the first adjustment circuit and configured to adjust an equivalent resistance value of the second adjustment circuit in response to a second encoded signal group, where the equivalent resistance value of the second adjustment circuit is denoted as a second resistance value, and the second encoded signal group is obtained by performing second compilation on the first control signal group or the second control signal group; an equivalent resistance value of the first adjustment circuit and the second adjustment circuit that are connected in parallel is related to the capability of the decision feedback equalization circuit to adjust the first output signal and the second output signal.

In some embodiments, the first encoded signal group includes a zeroth encoded signal and a first encoded signal, and the first adjustment circuit includes: a zeroth transistor and a first transistor that are connected in parallel, where a channel width-to-length ratio of the zeroth transistor is n, a channel width-to-length ratio of the first transistor is 2n, and a gate of the zeroth transistor and a gate of the first transistor receive the zeroth encoded signal and the first encoded signal, respectively; the second encoded signal group includes a second encoded signal, a third encoded signal, and a fourth encoded signal, and the second adjustment circuit includes: a second transistor, a third transistor, and a fourth transistor that are connected in parallel, where a channel width-to-length ratio of the second transistor is n, a channel width-to-length ratio of the third transistor is 2n, a channel width-to-length ratio of the fourth transistor is 2n, and a gate of the second transistor, a gate of the third transistor, and a gate of the fourth transistor receive the second encoded signal, the third encoded signal, and the fourth encoded signal, respectively, where n is an integer greater than or equal to 1.

In some embodiments, the decision feedback equalization circuit further includes: a decoding circuit, configured to perform a logical operation on the first control signal group and the second control signal group to obtain the first encoded signal group and the second encoded signal group.

In some embodiments, the decoding circuit is configured to control: if data of the most significant bit in the second control signal group is 1, the third encoded signal and the fourth encoded signal to be in a valid state. The third transistor is turned on in response to the third encoded signal in the valid state, and the fourth transistor is turned on in response to the fourth encoded signal in the valid state.

In some embodiments, the decoding circuit is configured to control: if data of each of two most significant bits in the second control signal group is 1, the first encoded signal to be in a valid state; or if data of the most significant bit in the first control signal group is 1, the first encoded signal to be in a valid state, where the first transistor is turned on in response to the first encoded signal in the valid state.

In some embodiments, the first control signal group includes a zeroth control signal and a first control signal; the second control signal group includes a second control signal, a third control signal, and a fourth control signal; the decoding circuit includes: three first inverters, where the first inverters receive the zeroth control signal, the second control signal, and the fourth control signal, respectively, and correspondingly, output the zeroth encoded signal, the second encoded signal, and the fourth encoded signal, respectively; an NOR gate, where two input terminals of the NOR gate receive the third control signal and the fourth control signal, respectively, and the NOR gate outputs the third encoded signal; and a logic circuit, where three input terminals of the logic circuit receive the first control signal, the third control signal, and the fourth control signal, respectively, and the logic circuit outputs the first encoded signal, where if each of the third control signal and the fourth control signal has a logic high level, the first encoded signal has a logic low level; if at least one of the third control signal and the fourth control signal has a logic low level, the first encoded signal and the first control signal have opposite levels and phases.

In some embodiments, the logic circuit includes: an OR gate, where two input terminals of the OR gate receive a reverse-phase signal of the third control signal and a reverse-phase signal of the fourth control signal, respectively; an NAND gate, where one input terminal of the NAND gate receives a reverse-phase signal of the first control signal, and the other input terminal of the NAND gate is connected to an output terminal of the OR gate; and a second inverter, where an input terminal of the second inverter is connected to an output terminal of the NAND gate, and an output terminal of the second inverter outputs the first encoded signal.

In some embodiments, the logic circuit further includes: a third inverter, where the third inverter receives the first control signal and outputs the reverse-phase signal of the first control signal; and two fourth inverters, where the fourth inverters receive the third control signal and the fourth control signal, respectively, and output the reverse-phase signal of the third control signal and the reverse-phase signal of the fourth control signal, respectively.

In some embodiments, the receive circuit includes: a first amplifier module, configured to receive the data signal and the reference signal, compare the data signal with the reference signal in response to the sampling clock signal, output a first voltage signal through a first node, and output a second voltage signal through a second node; and a second amplifier module, connected to the first node and the second node and configured to perform amplification processing on a voltage difference between the first voltage signal and the second voltage signal, output the first output signal through a third node, and output the second output signal through a fourth node, where the feedback node includes a first feedback node and a second feedback node, the first node serves as the first feedback node, the second node serves as the second feedback node, and the decision feedback equalization circuit is configured to perform decision feedback equalization on the first node and the second node based on the feedback signal to adjust the first voltage signal and the second voltage signal.

In some embodiments, the data receiving circuit further includes an offset compensation circuit, connected to the second amplifier module and configured to compensate an offset voltage of the second amplifier module.

In some embodiments, the receive circuit includes: a first amplifier module, configured to receive the data signal and the reference signal, compare the data signal with the reference signal in response to the sampling clock signal, output a first voltage signal through a first node, and output a second voltage signal through a second node; and a second amplifier module, connected to the first node and the second node and configured to perform amplification processing on a voltage difference between the first voltage signal and the second voltage signal, output the first output signal through a third node, and output the second output signal through a fourth node, where the second amplifier module has a first internal node and a second internal node, and the first output signal and the second output signal are obtained based on a signal of the first internal node and a signal of the second internal node; the feedback node includes a first feedback node and a second feedback node, the first internal node serves as the first feedback node, the second internal node serves as the second feedback node, and the decision feedback equalization circuit is configured to perform decision feedback equalization on the first internal node and the second internal node based on the feedback signal.

In some embodiments, the data receiving circuit further includes an offset compensation circuit, connected to the first amplifier module and configured to compensate an offset voltage of the first amplifier module.

In some embodiments, the first amplifier module includes: a current source, configured to be connected between a power supply node and a fifth node to supply a current to the fifth node in response to the sampling clock signal; and a comparison circuit, connected to the fifth node, the first node, and the second node, and configured to: receive the data signal and the reference signal, and when the current source supplies the current to the fifth node in response to the sampling clock signal, compare the data signal with the reference signal, output the first voltage signal through the first node, and output the second voltage signal through the second node.

In some embodiments, the first amplifier module further includes: a first resetting circuit, connected to the first node and the second node, and configured to reset the first node and the second node.

In some embodiments, the second amplifier module includes: an input circuit, connected to the first node and the second node, and configured to compare the first voltage signal with the second voltage signal, provide a third voltage signal to a seventh node, and provide a fourth voltage signal to an eighth node, where the second amplifier module has the first internal node and the second internal node, the seventh node serves as the first internal node, and the eighth node serves as the second internal node; and a latch circuit, configured to amplify and latch the third voltage signal and the fourth voltage signal, output the first output signal to the third node, and output the second output signal to the fourth node.

According to some embodiments of the present invention, another aspect of the embodiments of the present invention further provides a data receiving system, including: a plurality of cascaded data transmission circuits, where each of the data transmission circuits includes the data receiving circuit described in any one of the above-mentioned embodiments and a latch circuit connected to the data receiving circuit, and each of the data receiving circuits is connected to a data port to receive a data signal; a data transmission circuit at a current stage is connected to a decision feedback equalization circuit of a data transmission circuit at a next stage, and an output of the data transmission circuit at the current stage is used as a feedback signal of the decision feedback equalization circuit of the data transmission circuit at the next stage; a data transmission circuit at a last stage is connected to a decision feedback equalization circuit of a data transmission circuit at a first stage, and an output of the data transmission circuit at the last stage is used as a feedback signal of the decision feedback equalization circuit of the data transmission circuit at the first stage.

According to some embodiments of the present invention, still another aspect of the embodiments of the present invention further provides a storage apparatus, including: a plurality of data ports; and a plurality of the data receiving systems described in the above-mentioned embodiments, where each of the data receiving systems corresponds to one of the data ports.

BRIEF DESCRIPTION OF DRAWINGS

One or more embodiments are illustrated by the figures in the accompanying drawings corresponding thereto. These example descriptions do not constitute a limitation on the embodiments. Elements having the same reference numerals in the accompanying drawings are denoted as similar elements, unless otherwise specifically stated, the figures in the accompanying drawings do not constitute a limitation on scale. To describe the technical solutions in the embodiments of the present invention or in the conventional technologies more clearly, the following briefly describes the accompanying drawings needed for describing the embodiments. Clearly, the accompanying drawings in the following description show merely some embodiments of the present invention, and a person of ordinary skill in the art can still derive other drawings from these accompanying drawings without creative efforts.

DESCRIPTION OF EMBODIMENTS

The following describes some embodiments of the present invention in detail with reference to the accompanying drawings. However, a person of ordinary skill in the art can understand that in some embodiments of the present invention, many technical details are provided to make readers better understand some embodiments of the present invention. However, even without these technical details and various variations and modifications based on the following embodiments, the technical solutions sought to be protected in some embodiments of the present invention can still be implemented.

Some embodiments of the present invention provide a data receiving circuit, and the data receiving circuit provided in some embodiments of the present invention is described in detail below with reference to the accompanying drawings.

Technical solutions provided in some embodiments of the present invention have at least the following advantages:

The decision feedback equalization circuit is integrated into the data receiving circuit, and the decision feedback equalization circuit is configured to adjust the first output signal and the second output signal, so as to reduce impact of inter-symbol interference on data receiving. Compared with a related technology in which a decision feedback equalizer is separately disposed for a storage apparatus to reduce inter-symbol interference, some embodiments of the present invention allow adjustment of a signal output by the data receiving circuit by using a smaller circuit layout area and with lower power consumption, and reduce impact of inter-symbol interference of data received by the data receiving circuit on the data receiving circuit by flexibly controlling the capability of the decision feedback equalization circuit to adjust the first output signal and the second output signal, thereby improving the receiving performance of the data receiving circuit and reducing impact of the inter-symbol interference of the data on accuracy of the signal output by the data receiving circuit. In addition, the capability of the decision feedback equalization circuit to adjust the first output signal and the second output signal is related not only to the first control signal group corresponding to the data port that corresponds to the data signal, but also to the second control signal group corresponding to all the data ports, so that the adjustment capability described above is variable based on two different control signal groups and has a large variable range, thereby further alleviating the inter-symbol interference problem.

Figure 1:
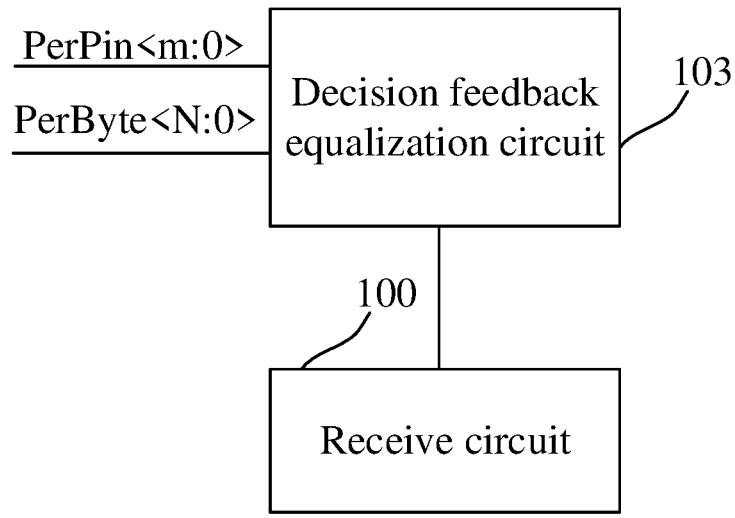
FIG. 1 is a block diagram of a data receiving circuit according to some embodiments of the present invention.

Referring to FIG. 1, a data receiving circuit 110 includes: a receive circuit 100, configured to receive a reference signal Vref and a data signal DQ from data ports, compare the data signal DQ with the reference signal Vref in response to a sampling clock signal CLK1, and output a first output signal Vout and a second output signal VoutN; and a decision feedback equalization circuit 103, connected to a feedback node of the receive circuit 100 and configured to perform decision feedback equalization on the receive circuit 100 based on a feedback signal to adjust the first output signal Vout and the second output signal VoutN, where the feedback signal is obtained based on previously received data, the decision feedback equalization circuit 103 responds to a first control signal group PerPin<m:0> and a second control signal group PerByte<N:0> to adjust a capability to adjust the first output signal Vout and the second output signal VoutN, the first control signal group PerPin<m:0> corresponds to one of the data ports corresponding to the data signal, and the second control signal group PerByte<N:0> corresponds to all of the data ports.

The decision feedback equalization circuit 103 is integrated into the data receiving circuit, to adjust a signal output by the data receiving circuit by using a smaller circuit layout area and with lower power consumption. As shown in the embodiments, the data receiving circuit is configured to perform its function without including an adder, thereby reducing the circuit layout area. In addition, the capability of the decision feedback equalization circuit 103 provided in some embodiments of the present invention to adjust the first output signal Vout and the second output signal VoutN is adjustable. It can be understood that, when the data signal DQ and/or the reference signal Vref received by the receive circuit 100 changes, the capability of the decision feedback equalization circuit 103 to adjust the first output signal Vout and the second output signal VoutN can be flexibly controlled to reduce impact of intersymbol interference of data received by the data receiving circuit on the data receiving circuit, thereby improving the receiving performance of the data receiving circuit and reducing impact of the inter-symbol interference of the data on accuracy of the signal output by the data receiving circuit. In addition, the capability of the decision feedback equalization circuit 103 to adjust the first output signal Vout and the second output signal VoutN is related to both the first control signal group PerPin<m:0> and the second control signal group PerByte<N:0>, that is, the adjustment capability is related not only to a single data port, but also to all the data ports, so that the decision feedback equalization circuit 103 has a larger adjustable range, and correspondingly has a stronger capability to alleviate inter-symbol interference and provides higher pertinence to different data ports.

The first control signal group PerPin<m:0> corresponds to a data port for transmitting the data signal, that is, a control signal in the first control signal group PerPin<m:0> corresponds to only a specific data port. It can be understood that, for different data receiving circuits of data ports, for example, the first data receiving circuit connected to the data port DQ1 and the second data receiving circuit connected to the data port DQ2, the first control signal groups PerPin<m:0> corresponding to the two data receiving circuits are different. Further, the first control signal group PerPin<m:0> corresponding to the first data receiving circuit is designed based on the data port DQ1, and the first control signal group PerPin<m:0> corresponding to the second data receiving circuit is designed based on the data port DQ2. The data received by the different data ports is subjected to different inter-symbol interference, and data signals DQ are also subjected to different interference in a transmission path. Therefore, a different first control signal group PerPin<m:0> for the data signal DQ received by each data port is designed separately to adjust each data port pertinently by using an adjustment circuit 1132, so as to further improve receiving performance of the data receiving circuit.

The second control signal group PerByte<N:0> corresponds to all the data ports in the data receiving circuit, that is, the control signal in the second control signal group PerByte<N:0> corresponds to all the data ports. The control signal in the second control signal group PerByte<N:0> may be common to all data receiving circuits, that is, for different data receiving circuits connected to different data ports, the second control signal group PerByte<N:0> provided to different data receiving circuits is common. Designing a second control signal group PerByte<N:0> that is common to different data ports further expands a capability adjustment range of a decision feedback equalization circuit of each data receiving circuit.

It should be noted that the connection between the decision feedback equalization circuit 103 and the feedback node of the receive circuit 100 includes at least the following two examples.

Figure 3:
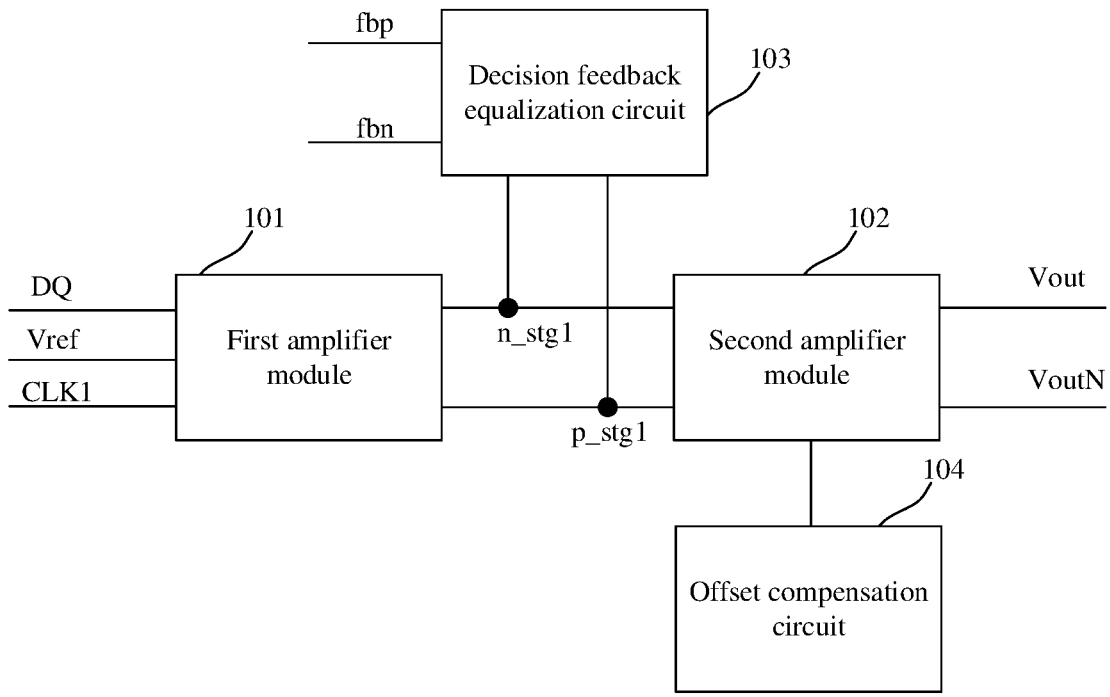
FIG. 3 and FIG. 4 are two other block diagrams of a data receiving circuit according to some embodiments of the present invention.

In some embodiments, referring to FIG. 3, the receive circuit 100 (referring to FIG. 1) may include: a first amplifier module 101, configured to receive the data signal DQ and the reference signal Vref, compare the data signal DQ with the reference signal Vref in response to the sampling clock signal CLK1, output a first voltage signal through a first node n_stg1, and output a second voltage signal through a second node p_stg1; and a second amplifier module 102, connected to the first node n_stg1 and the second node p_stg1, and configured to perform amplification processing on a voltage difference between the first voltage signal and the second voltage signal, output the first output signal Vout through a third node net3 (referring to FIG. 6), and output the second output signal VoutN through a fourth node net4 (referring to FIG. 6), where the feedback node includes a first feedback node and a second feedback node, the first node n_stg1 serves as the first feedback node, the second node p_stg1 serves as the second feedback node, and the decision feedback equalization circuit 103 is configured to perform decision feedback equalization on the first node n_stg1 and the second node p_stg1 based on the feedback signal to adjust the first voltage signal and the second voltage signal.

It should be noted that, the second amplifier module 102 receives the first voltage signal and the second voltage signal, and performs amplification processing on the voltage difference between the first voltage signal and the second voltage signal to output the first output signal Vout and the second output signal VoutN. In other words, the first output signal Vout and the second output signal VoutN are affected by the first voltage signal and the second voltage signal. The decision feedback equalizing module 103 adjusts the first voltage signal and the second voltage signal based on the feedback signal, thereby further adjusting the first output signal Vout and the second output signal VoutN. In addition, the adjustment of the first voltage signal and the second voltage signal by the decision feedback equalization circuit 103 is described in detail below with reference to a circuit diagram.

In some embodiments, still referring to FIG. 3, the data receiving circuit may further include an offset compensation circuit 104, connected to the second amplifier module 102 and configured to compensate an offset voltage of the second amplifier module 102. It should be noted that, a specific connection relationship between the offset compensation circuit 104 and the second amplifier module 102 is described in detail below with reference to a circuit diagram.

Figure 13:
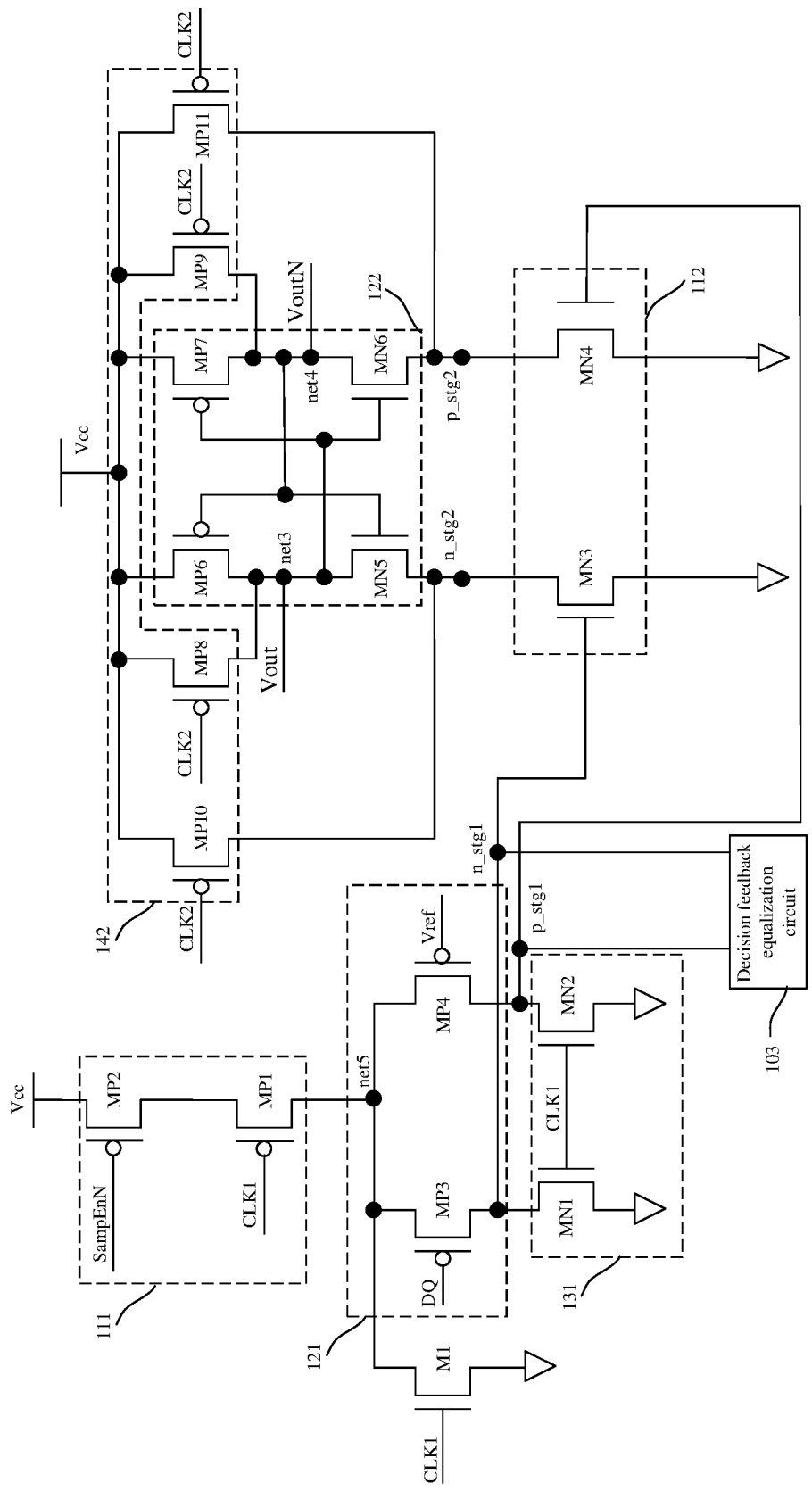
FIG. 13 and FIG. 14 are schematic diagrams of two other circuit structures of a data receiving circuit according to some embodiments of the present invention.

In some other embodiments, referring to FIG. 13, the receive circuit 100 (referring to FIG. 1) may include: a first amplifier module 101, configured to receive the data signal DQ and the reference signal Vref, compare the data signal DQ with the reference signal Vref in response to the sampling clock signal CLK1, output a first voltage signal through a first node n_stg1, and output a second voltage signal through a second node p_stg1; and a second amplifier module 102, connected to the first node n_stg1 and the second node p_stg1, and configured to perform amplification processing on a voltage difference between the first voltage signal and the second voltage signal, output the first output signal Vout through a third node net3, and output the second output signal VoutN through a fourth node net4. The second amplifier module 102 has a first internal node n_stg2 and a second internal node p_stg2, and the first output signal Vout and the second output signal VoutN are obtained based on a signal of the first internal node n_stg2 and a signal of the second internal node p_stg2. The feedback node includes a first feedback node and a second feedback node, the first internal node n_stg2 serves as the first feedback node, the second internal node p_stg2 serves as the second feedback node, and the decision feedback equalization circuit 103 is configured to perform decision feedback equalization on the first internal node n_stg2 and the second internal node p_stg2 based on the feedback signal.

It should be noted that, the voltage signal at the first internal node n_stg2 is a third voltage signal and the voltage signal at the second internal node p_stg2 is a fourth voltage signal. The decision feedback equalization circuit 103 performs decision feedback equalization on the first internal node n_stg2 and the second internal node p_stg2 based on the feedback signal. In other words, the decision feedback equalization circuit 103 adjusts the third voltage signal and the fourth voltage signal. The first output signal Vout and the second output signal VoutN are based on the third voltage signal and the fourth voltage signal, so that the decision feedback equalization circuit 103 adjusts the third voltage signal and the fourth voltage signal based on the feedback signal, thereby further adjusting the first output signal Vout and the second output signal VoutN. In addition, the adjustment of the third voltage signal and the fourth voltage signal by the decision feedback equalization circuit 103 is described in detail below with reference to a circuit diagram.

In some embodiments, the data receiving circuit may further include an offset compensation circuit, connected to the first amplifier module and configured to compensate an offset voltage of the first amplifier module. It should be noted that, a connection relationship between the offset compensation circuit and the first amplifier module is described in detail below.

In the above-mentioned examples, the data receiving circuit uses two stages of amplifier modules, namely, the first amplifier module 101 and the second amplifier module 102, to process the data signal DQ and the reference signal Vref, thereby enhancing an amplification capability of the data receiving circuit, increase a voltage amplitude of the first output signal Vout and the second output signal VoutN, and perform subsequent circuit processing. In addition, the decision feedback equalization circuit 103 is configured to reduce inter-symbol interference by equivalently adjusting the data signal DQ.

The structure of a data receiving circuit provided in some embodiments of the present invention is described in detail below with reference to FIG. 4 to FIG. 13. It should be noted that the following detailed description of each module applies to both of the above-mentioned examples.

Figure 4:
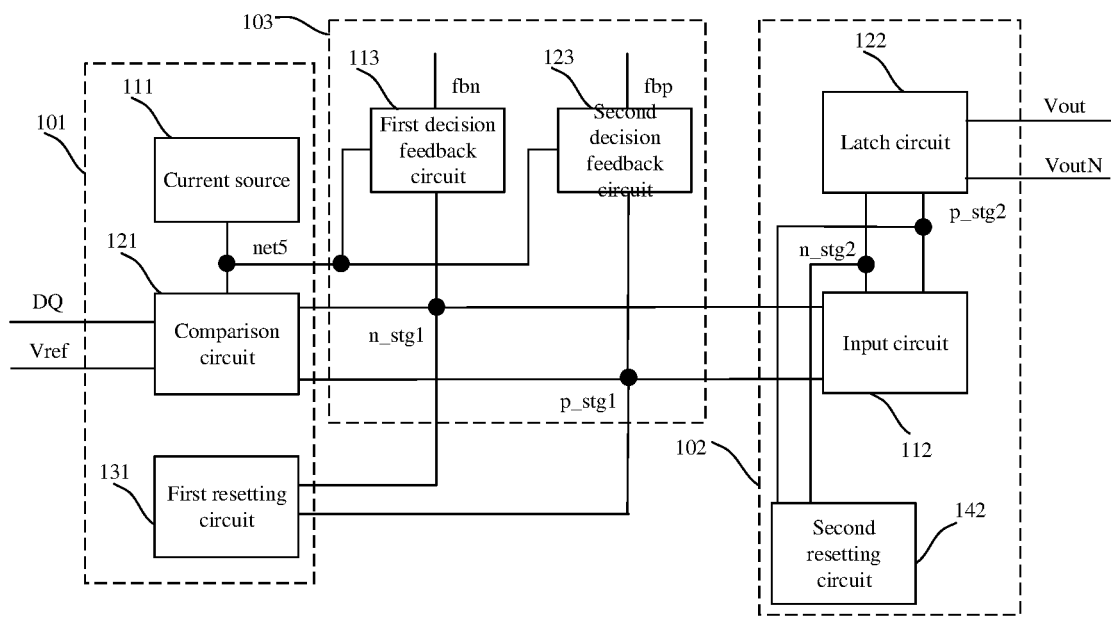

In some embodiments, referring to FIG. 4, the first amplifier module 101 may include: a current source 111, configured to be connected between a power supply node Vcc (referring to FIG. 6) and a fifth node net5 to supply a current to the fifth node net5 in response to the sampling clock signal CLK1; and a comparison circuit 121, connected to the fifth node net5, the first node n_stg1, and the second node p_stg1, and configured to: receive the data signal DQ and the reference signal Vref, and when the current source 111 supplies the current to the fifth node net5 in response to the sampling clock signal CLK1, compare the data signal DQ with the reference signal Vref, output the first voltage signal through the first node n_stg1, and output the second voltage signal through the second node p_stg1.

It can be understood that the comparison circuit 121 can control a difference between the current supplied to the first node n_stg1 and the current supplied to the second node p_stg1 based on the difference between the data signal DQ and the reference signal Vref, so as to output the first voltage signal and the second voltage signal.

The first amplifier module 101 is described in detail below with reference to FIG. 6, FIG. 12, and FIG. 13.

Figure 6:
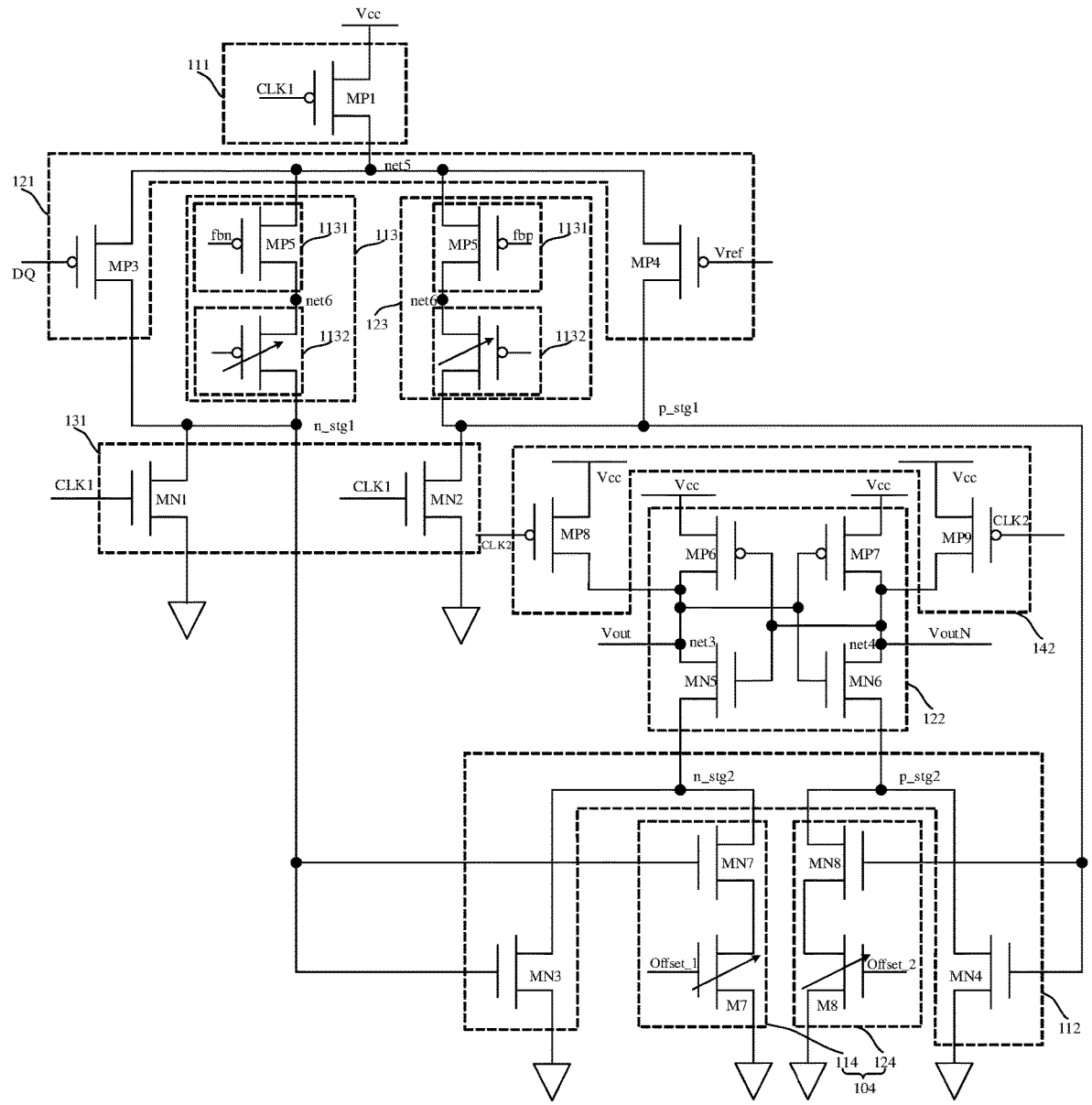
FIG. 6 is a schematic diagram of a circuit structure corresponding to FIG. 3.
Figure 12:
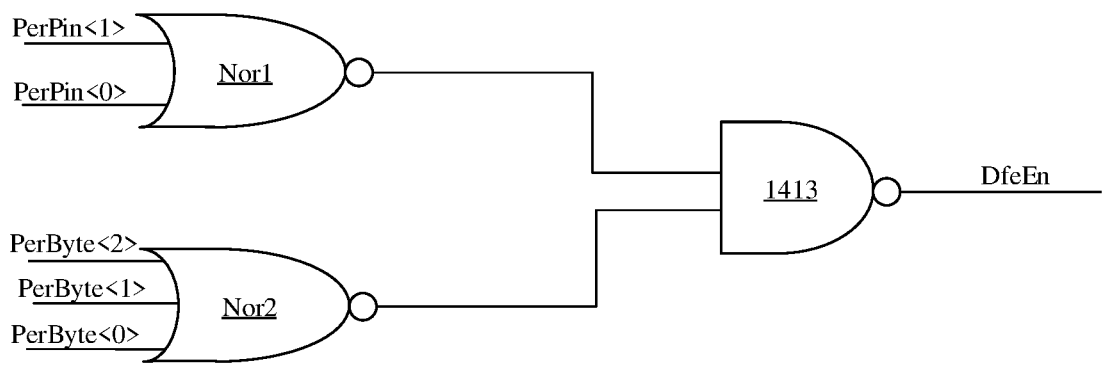
FIG. 12 is a schematic diagram of a structure of an equivalent circuit between a decision enable signal and each of a first control signal group and a second control signal group in a decision feedback equalization circuit according to some embodiments of the present invention.

In some embodiments, referring to FIG. 6, FIG. 12, and FIG. 13, the current source 111 may include a first PMOS transistor MP1, which is connected between the power supply node Vcc and the fifth node net5. A gate of the first PMOS transistor MP1 receives the sampling clock signal CLK1. When the sampling clock signal CLK1 has a low level, the gate of the first PMOS transistor MP1 receives the sampling clock signal CLK1 to turn on the first PMOS transistor MP1, and the first PMOS transistor MP1 supplies a current to the fifth node net5 so that the comparison circuit 121 is in an operating state, and compares the received data signal DQ with the received reference signal Vref.

In some embodiments, still referring to FIG. 12, on the basis of including the first PMOS transistor MP1, the current source 111 may further include a second PMOS transistor MP2, which is connected between the power supply node Vcc and the first PMOS transistor MP1. A gate of the second PMOS transistor MP2 receives an enable signal SampEnN. When the sampling clock signal CLK1 has a low level and the enable signal SampEnN also has a low level, both the first PMOS transistor MP1 and the second PMOS transistor MP2 are turned on to supply a current to the fifth node net5 so that the comparison circuit 121 is in an operating state, and compare the received data signal DQ with the received reference signal Vref.

In addition, arrangement of the second PMOS transistor MP2 that is in a turn-on or turn-off state based on the enable signal SampEnN allows control of the second PMOS transistor MP2 to be turned off based on the enable signal SampEnN when a device including a data receiving circuit is in a low power consumption mode, so as to turn off the data receiving circuit corresponding to the second PMOS transistor MP2 and reduce overall power consumption of the device including the data receiving circuit.

In some embodiments, referring to FIG. 6, FIG. 12, and FIG. 13, the comparison circuit 121 may include: a third PMOS transistor MP3, which is connected between the fifth node net5 and the first node n_stg1, where a gate of the third PMOS transistor MP3 receives the data signal DQ; and a fourth PMOS transistor MP4, which is connected between the fifth node net5 and the second node p_stg1, where a gate of the fourth PMOS transistor MP4 receives the reference signal Vref.

It should be noted that, changes of level values of the data signal DQ and the reference signal Vref are not synchronized, and as a result, a moment at which the third PMOS transistor MP3 receiving the data signal DQ is turned on is different from a moment at which the fourth PMOS transistor MP4 receiving the reference signal Vref is turned on, and at a same moment, a turn-on degree of the third PMOS transistor MP3 is different from a turn-on degree of the fourth PMOS transistor MP4. It can be understood that, based on the fact that the turn-on degree of the third PMOS transistor MP3 is different from the turn-on degree of the fourth PMOS transistor MP4, capabilities of the third PMOS transistor MP3 and the fourth PMOS transistor MP4 to offload the current at the fifth node net5 are also different, and as a result, the voltage at the first node n_stg1 is different from the voltage at the second node p_stg1.

In some examples, when the level value of the data signal DQ is smaller than the level value of the reference signal Vref, the turn-on degree of the third PMOS transistor MP3 is greater than the turn-on degree of the fourth PMOS transistor MP4, so that a larger part of the current at the fifth node net5 flows into a path on which the third PMOS transistor MP3 is located, and the current at the first node n_stg1 is greater than the current at the second node p_stg1, thereby further ensuring that the level value of the first voltage signal output by the first node n_stg1 is large and the level value of the second voltage signal output by the second node p_stg1 is small.

In some embodiments, referring to FIG. 4, the first amplifier module 101 may further include a first resetting circuit 131, connected to the first node n_stg1 and the second node p_stg1, and configured to reset the first node n_stg1 and the second node p_stg1. As such, after completing the reception of the data signal DQ and the reference signal Vref and the output of the first output signal Vout and the second output signal VoutN for one time, the data receiving circuit may restore the level values at the first node n_stg1 and the second node p_stg1 to initial values by using the first resetting circuit 131, thereby facilitating next data reception and processing by the data receiving circuit later.

In some embodiments, still referring to FIG. 6, FIG. 12, and FIG. 13, the first resetting circuit 131 may include: a first NMOS transistor MN1, which is connected between the first node n_stg1 and the ground, where a gate of the first NMOS transistor MN1 receives the sampling clock signal CLK1; and a second NMOS transistor MN2, which is connected between the second node p_stg1 and the ground, where a gate of the second NMOS transistor MN2 receives the sampling clock signal CLK1.

In some examples, when both the sampling clock signal CLK1 and the enable signal SampEnN have a low level, both the first PMOS transistor MP1 and the second PMOS transistor MP2 are turned on, and in such case, both the first NMOS transistor MN1 and the second NMOS transistor MN2 are turned off to ensure normal operation of the data receiving circuit. In addition, the first NMOS transistor MN1 and the second NMOS transistor MN2 can serve as loads of the first amplifier module 101 to increase an amplification gain of the first amplifier module 101. When the sampling clock signal CLK1 has a high level, the first PMOS transistor MP1 is turned off, and in such case, both the first NMOS transistor MN1 and the second NMOS transistor MN2 are turned on to pull down the voltage at the first node n_stg1 and the voltage at the second node p_stg1, thereby resetting the first node n_stg1 and the second node p_stg1.

The decision feedback equalization circuit 103 is described in detail below by using two examples. In one example, the decision feedback equalization circuit 103 is connected to the first node n_stg1 and the second node p_stg1 in the first amplifier module 101 to adjust the first voltage signal and the second voltage signal output by the first amplifier module 101. In the other example, the decision feedback equalization circuit 103 is connected to the first internal node n_stg2 and the second internal node p_stg2 in the second amplifier module 102 to adjust the voltage at the first internal node n_stg2 and the voltage at the second internal node p_stg2.

In some embodiments, referring to FIG. 6 and FIG. 12, the first node n_stg1 may serve as a first feedback node and the second node p_stg1 may serve as a second feedback node. The feedback signal includes a first feedback signal fbn and a second feedback signal fbp. The decision feedback equalization circuit 103 may include: a first decision feedback circuit 113, connected to the first node n_stg1 and the fifth node net5, and configured to perform decision feedback equalization on the first node n_stg1 based on the first feedback signal fbn to adjust the first voltage signal; and a second decision feedback circuit 123, connected to the second node p_stg1 and the fifth node net5, and configured to perform decision feedback equalization on the second node p_stg1 based on the second feedback signal fbp to adjust the second voltage signal.

The first decision feedback circuit 113 is configured to adjust the current in the third PMOS transistor MP3 to adjust the voltage at the first node n_stg1, which is equivalent to adjusting the data signal DQ. The second decision feedback circuit 123 is configured to adjust the current in the fourth PMOS transistor MP4 to adjust the voltage at the second node p_stg1, which is equivalent to adjusting the reference signal Vref.

Figure 5:
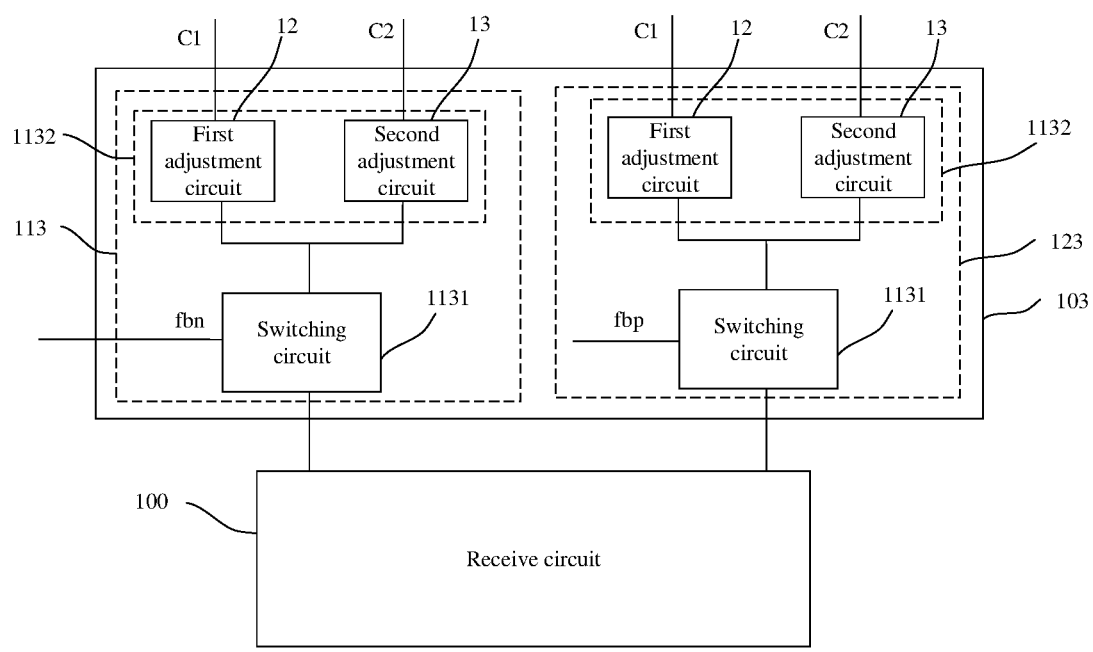
FIG. 5 is another block diagram of a data receiving circuit according to some embodiments of the present invention.

In some embodiments, referring to FIG. 5, the decision feedback equalization circuit 103 may include: a first adjustment circuit 12, configured to adjust an equivalent resistance value of the first adjustment circuit 12 in response to a first encoded signal group C1, where the equivalent resistance value of the first adjustment circuit 12 is denoted as a first resistance value, and the first encoded signal group C1 is obtained by performing first compilation on the first control signal group PerPin<m:0> and/or the second control signal group PerByte<N:0>; and a second adjustment circuit 13, connected in parallel to the first adjustment circuit 12 and configured to adjust an equivalent resistance value of the second adjustment circuit 13 in response to the second encoded signal group C2, where the equivalent resistance value of the second adjustment circuit 13 is denoted as a second resistance value, and the second encoded signal group C2 is obtained by performing second compilation on the first control signal group PerPin<m:0> or the second control signal group PerByte<N:0>; an equivalent resistance value of the first adjustment circuit 12 and the second adjustment circuit 13 that are connected in parallel is related to the capability of the decision feedback equalization circuit 103 to adjust the first output signal Vout and the second output signal VoutN.

The first adjustment circuit 12 and the second adjustment circuit 13 jointly form the adjustment circuit 1132, and the adjustment circuit 1132 is a load of the decision feedback equalization circuit 103. When a magnitude of an equivalent resistance value of the load changes, the adjustment capability of the decision feedback equalization circuit 103 changes accordingly.

In some examples, some encoded signals in the first encoded signal group C1 may be obtained by performing compilation on the first control signal group PerPin<m:0> or the second control signal group PerByte<N:0>, and the remaining encoded signals may be obtained by performing compilation on the first control signal group PerPin<m:0> and the second control signal group PerByte<N:0>.

Figure 7:
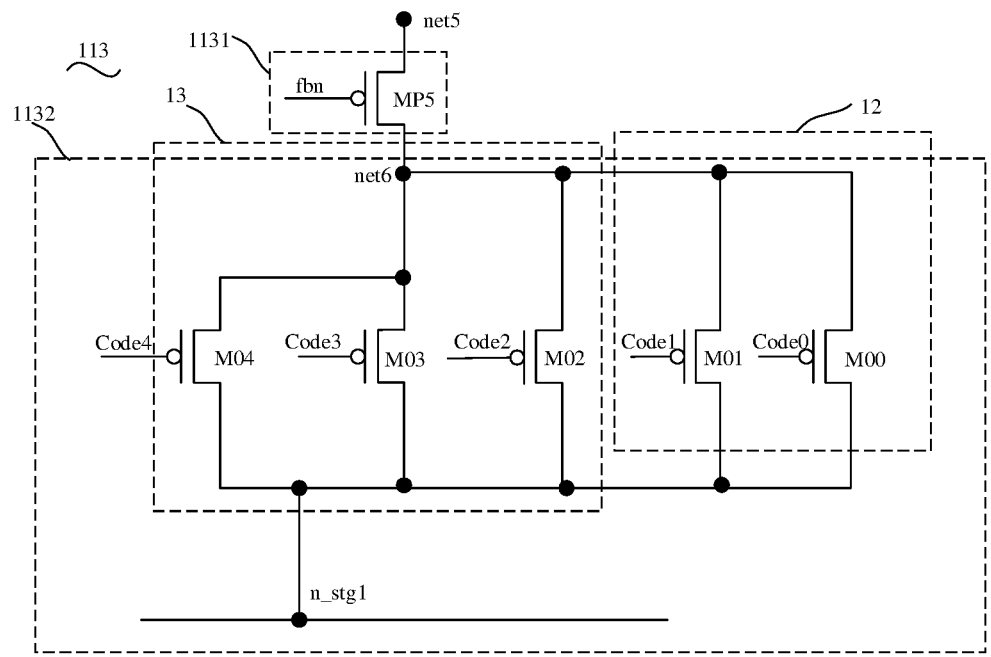
FIG. 7 is another block diagram of a data receiving circuit according to some embodiments of the present invention.

In some embodiments, referring to FIG. 7, the first encoded signal group C1 includes a zeroth encoded signal Code0 and a first encoded signal Code1. The first adjustment circuit 12 may include a zeroth transistor M00 and a first transistor M01 that are connected in parallel. A channel width-to-length ratio of the zeroth transistor M00 is n, a channel width-to-length ratio of the first transistor M01 is 2n, and a gate of the zeroth transistor M00 and a gate of the first transistor M01 receive the zeroth encoded signal Code0 and the first encoded signal Code1, respectively. The second encoded signal group C2 includes a second encoded signal Code2, a third encoded signal Code3, and a fourth encoded signal Code4. The second adjustment circuit 13 includes a second transistor M02, a third transistor M03, and a fourth transistor M04 that are connected in parallel. A channel width-to-length ratio of the second transistor M02 is n, a channel width-to-length ratio of the third transistor M03 is 2n, a channel width-to-length ratio of the fourth transistor M04 is 2n, and a gate of the second transistor M02, a gate of the third transistor M03, and a gate of the fourth transistor M04 receive the second encoded signal Code2, the third encoded signal Code3, and the fourth encoded signal Code4, respectively, where n is an integer greater than or equal to 1.

In other words, the channel width-to-length ratios of the fourth transistor M04, the third transistor M03, and the first transistor M01 are the same, and are defined as a first channel width-to-length ratio. The channel width-to-length ratios of the zeroth transistor M00 and the second transistor M02 are the same, and are defined as a second channel width-to-length ratio. The first channel width-to-length ratio is greater than the second channel width-to-length ratio.

In some examples, the first channel width-to-length ratio may be twice the second channel width-to-length ratio.

In some more examples, channel lengths of the zeroth transistor M00, the first transistor M01, the second transistor M02, the third transistor M03, and the fourth transistor M04 may be the same, and correspondingly, a ratio of channel widths of the zeroth transistor M00, the first transistor M01, the second transistor M02, the third transistor M03, and the fourth transistor M04 is 1:2:1:2:2. A load at a sixth node net6 is related to an equivalent capacitance of each transistor. A smaller channel width of the transistor indicates a smaller equivalent capacitance of the transistor. Compared with the technical solution in which a ratio of channel widths of the zeroth transistor, the first transistor, the second transistor, the third transistor, and the fourth transistor is 1:2:1:2:4, the ratio of the channel widths of the zeroth transistor M00, the first transistor M01, the second transistor M02, the third transistor M03, and the fourth transistor M04 is 1:2:1:2:2. Since the channel width of the fourth transistor M04 is smaller, an overall size of the transistor needed by the first adjustment circuit 12 is also smaller, so that the equivalent capacitance at the sixth node net6 is smaller, and correspondingly, the load at the sixth node net6 is also smaller, thereby reducing the load of the data receiving circuit.

Each of the zeroth transistor M00, the first transistor M01, the second transistor M02, the third transistor M03, and the fourth transistor M04 is a PMOS transistor, and is connected in parallel between the sixth node net6 and the first node n_stg1, and separately receives a corresponding encoded signal to control turn-on or turn-off between the sixth node net6 and the first node n_stg1, so that an overall equivalent resistance value of the adjustment circuit 1132 is flexibly controllable, thereby implementing flexible control of the voltage at the first node n_stg1 and further adjusting a decision feedback capability.

It can be understood that, respective resistances of the zeroth transistor M00, the first transistor M01, the second transistor M02, the third transistor M03, and the fourth transistor M04 are related to their respective channel width-to-length ratios. The channel width-to-length ratios of the zeroth transistor M00, the first transistor M01, the second transistor M02, the third transistor M03, and the fourth transistor M04 are n:2n:n:2n:2n, respectively, and correspondingly, the equivalent resistances of the zeroth transistor M00, the first transistor M01, the second transistor M02, the third transistor M03, and the fourth transistor M04 are 2R:1R:2R:1R:1R, respectively, so that the equivalent resistance value of the adjustment circuit 1132 is adjusted linearly, thereby implementing linear adjustment of the voltage at the first node n_stg1 and the voltage at the second node p_stg1.

In some embodiments, by adjusting whether or not each of the transistors (i.e., the zeroth transistor to the fourth transistor) in the first adjustment circuit 12 and the second adjustment circuit 13 is turned on, five transistors are used to obtain eight linear DFE adjustment capabilities. In addition, it can be learned from the foregoing analysis that the channel widths of the transistors included in the first adjustment circuit 12 are relatively small, and the transistors used in each of the first adjustment circuit 12 and the second adjustment circuit 13 have relatively small overall sizes, and correspondingly, may have relatively small equivalent capacitances. Relatively small equivalent capacitances lead to a relatively small load of the sixth node net6, so that the data receiving circuit has a relatively small load.

In some embodiments, referring to FIG. 7, either of the first decision feedback circuit 113 and the second decision feedback circuit 123 may include: a switching circuit 1131, configured to turn on the fifth node net5 and the sixth node net6 in response to the feedback signal; and an adjustment circuit 1132, connected between the sixth node net6 and an output node, where the output node is one of the first node n_stg1 and the second node p_stg1, and configured to adjust a magnitude of an equivalent resistance value between the sixth node net6 and the output node in response to the control signal. In the first decision feedback circuit 113, the feedback signal is the first feedback signal fbn, the output node is the first node n_stg1, and the switching circuit 1131 responds to the first feedback signal fbn. In the second decision feedback circuit 123, the feedback signal is the second feedback signal fbp, the output node is the second node p_stg1, and the switching circuit 1131 responds to the second feedback signal fbp.

The switching circuit 1131 in the first decision feedback circuit 113 is turned on or off based on the first feedback signal fbn, and the switching circuit 1131 in the second decision feedback circuit 123 is turned on or off based on the second feedback signal fbp. Regardless of the first decision feedback circuit 113 or the second decision feedback circuit 123, the adjustment circuit 1132 is in an operating state when the switching circuit 1131 is turned on, so as to adjust the voltage at the first node n_stg1 or the second node p_stg1.

In some embodiments, still referring to FIG. 7, the switching circuit 1131 may include a fifth PMOS transistor MP5, which is connected between the fifth node net5 and the sixth node net6, where a gate of the fifth PMOS transistor MP5 receives a feedback signal.

It should be noted that FIG. 7 shows merely an example in which the gate of the fifth PMOS transistor MP5 receives the first feedback signal fbn, and the output node is the first node n_stg1. FIG. 7 shows a structure of the first decision feedback circuit 113. In practice, a structure of the second decision feedback circuit 123 is similar to the structure of the first decision feedback circuit 113, except that the gate of the fifth PMOS transistor MP5 in the second decision feedback circuit 123 receives the second feedback signal fbp, and the output node is the second node p_stg1. Other parts are the same.

In some examples, the first feedback signal fbn received by the switching circuit 1131 in the first decision feedback circuit 113 has a low level, and the fifth PMOS transistor MP5 is turned on. In such case, the adjustment circuit 1132 adjusts the voltage at the first node n_stg1 based on the control signal. In some other examples, the second feedback signal fbp received by the switching circuit 1131 in the second decision feedback circuit 123 has a low level, and the fifth PMOS transistor MP5 is turned on. In such case, the adjustment circuit 1132 adjusts the voltage at the second node p_stg1 based on the control signal.

Figure 8:
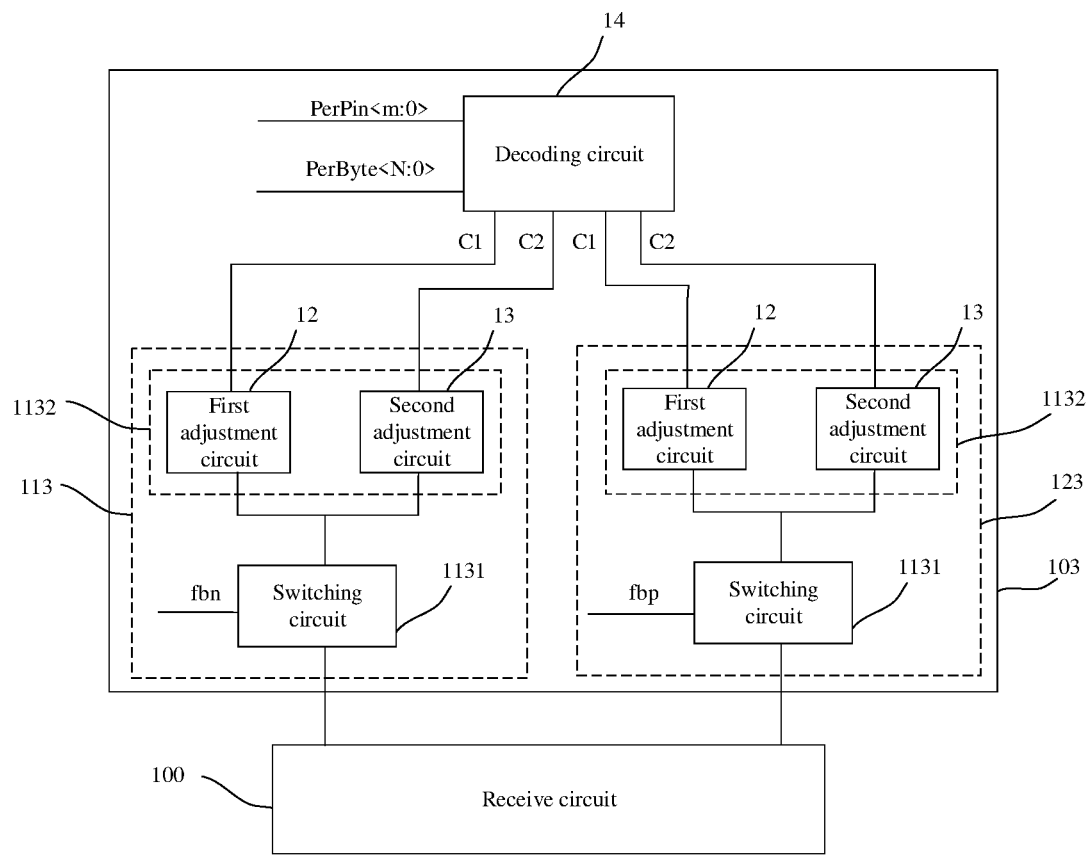
FIG. 8 is another block diagram of a data receiving circuit according to some embodiments of the present invention.

Referring to FIG. 8, the decision feedback equalization circuit 103 may further include a decoding circuit 14, configured to perform a logical operation on the first control signal group PerPin<m:0> and the second control signal group PerByte<N:0> to obtain the first encoded signal group C1 and the second encoded signal group C2.

The second control signal group PerByte<N:0> has data of the most significant bit, that is, data in an N-th bit, and also has data of two most significant bits, that is, data in the N-th bit and an (N−1)-th bit. The first control signal group PerPin<m:0> has data of the most significant bit, that is, data in an m-th bit.

The decoding circuit 14 may be configured to: if the data of the most significant bit in the second control signal group PerByte<N:0> is 1, both the third encoded signal Code3 and the fourth encoded signal Code4 are in a valid state, the third transistor M03 is turned on in response to the third encoded signal Code3 in the valid state, and the fourth transistor M04 is turned on in response to the fourth encoded signal Code4 in the valid state.

Each of the channel width-to-length ratio of the third transistor M03 and the channel width-to-length ratio of the fourth transistor M04 is twice the channel width-to-length ratio of the second transistor M02. Compared with the adjustment capability of the decision feedback equalization circuit 103 when only the second transistor M02 is turned on, when both the third transistor M03 and the fourth transistor M04 are turned on, the decision feedback equalization circuit 103 has at least four times of the adjustment capability. In other words, at least four times of the adjustment capability can be obtained provided that two transistors are turned on.

The decoding circuit 14 may be configured to: if data of each of two most significant bits in the second control signal group PerByte<N:0> is 1, the first encoded signal Code1 is in a valid state; or if data of the most significant bit in the first control signal group PerPin<m:0> is 1, the first encoded signal Code1 is in a valid state, where the first transistor M01 is turned on in response to the first encoded signal Code1 in the valid state.

Compared with the adjustment capability of the decision feedback equalization circuit 103 when the zeroth transistor M00 is turned on, when the first transistor M01 is turned on, the decision feedback equalization circuit 103 has at least two times of the adjustment capability. In other words, at least two times of the adjustment capability can be obtained provided that one transistor is turned on.

It can be understood that, if the third transistor M03 is an NMOS transistor, the third encoded signal Code3 is 1, that is, is in a valid state; if the third transistor M03 is a PMOS transistor, the third encoded signal Code3 is 0, that is, is in a valid state. If the fourth transistor M04 is an NMOS transistor, the fourth encoded signal Code4 is 1, that is, is in a valid state. If the fourth transistor M04 is a PMOS transistor, the fourth encoded signal Code4 is 0, that is, is in a valid state. If the first transistor M01 is an NMOS transistor, the first encoded signal Code1 is 1, that is, is in a valid state. If the first transistor M01 is a PMOS transistor, the first encoded signal Code1 is 0, that is, is in a valid state.

In some embodiments, the first control signal group PerPin<m:0> may be 2-bit data, and the first control signal group PerPin<m:0> includes a zeroth PerPin<0> and a first control signal PerPin<1>. The second control signal group PerByte<N:0> may be 3-bit data, and the second control signal group PerByte<N:0> includes the second control signal PerByte<0>, the third control signal PerByte<1>, and the fourth control signal PerByte<2>.

In some embodiments, the decoding circuit 14 may be configured to: if the fourth control signal PerByte<2> is 1, both the third encoded signal Code3 and the fourth encoded signal Code4 are 0, and correspondingly, the third transistor M03 and the fourth transistor M04 are turned on. In other words, the third encoded signal Code3 is 0, indicating that the third encoded signal Code3 is in a valid state, and the fourth encoded signal Code4 is 0, indicating that the fourth encoded signal Code4 is in a valid state.

Figure 9:
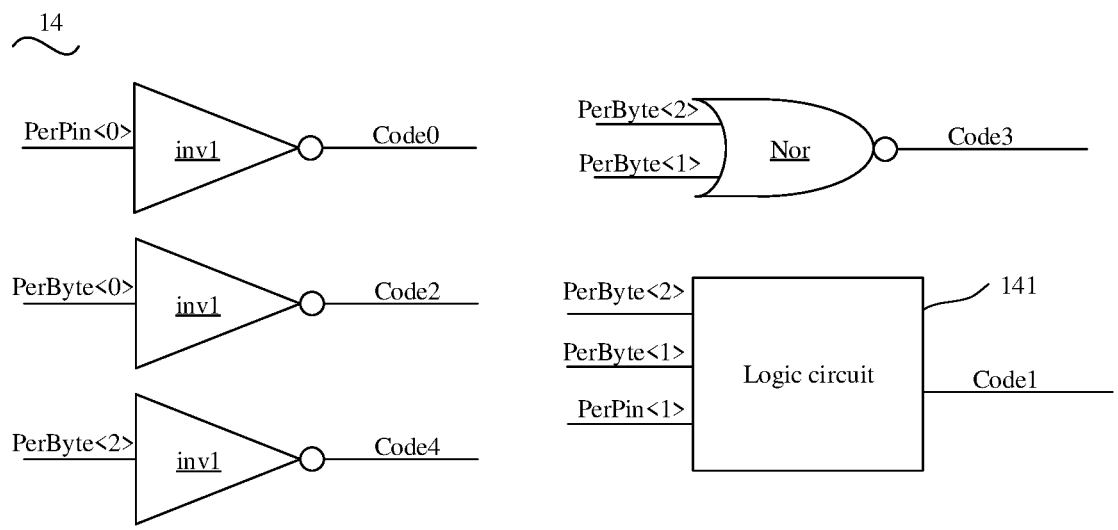
FIG. 9 to FIG. 11 are schematic diagrams of a partial circuit structure of a decision feedback equalization circuit in a data receiving circuit according to some embodiments of the present invention.
Figure 10:
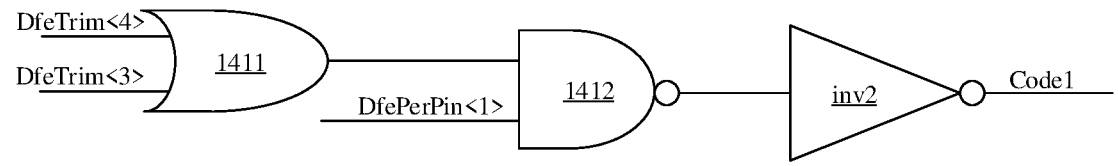
Figure 11:
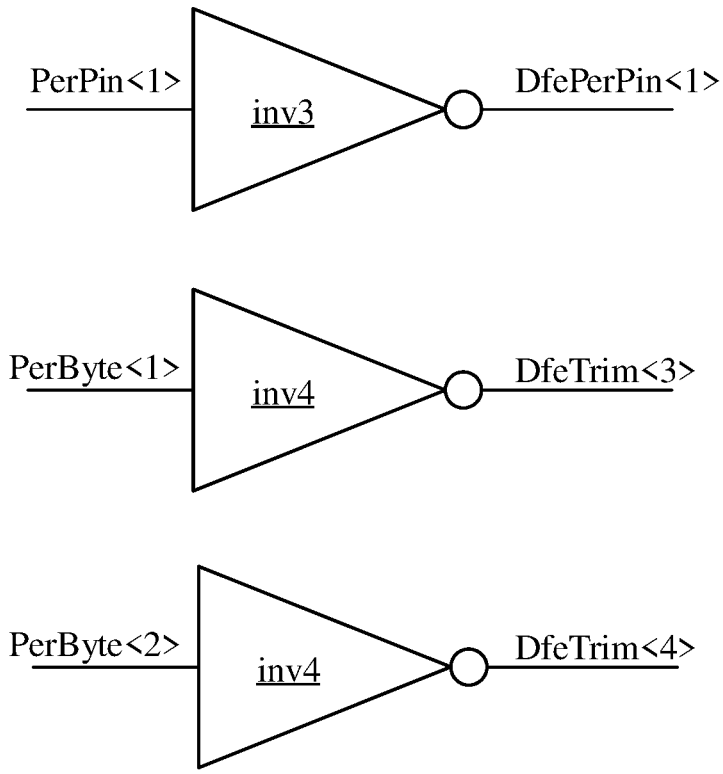

In some embodiments, the decoding circuit 14 may be further configured to: if both the fourth control signal PerByte<2> and the third control signal PerByte<1> are 1, the first encoded signal Code1 is 0, and correspondingly, the first transistor M01 is turned on; or if the first control signal PerPin<1> is 1, the first encoded signal Code1 is 0, and correspondingly, the first transistor M01 is turned on. In other words, the first encoded signal Code1 is 0, indicating that the first encoded signal Code1 is in a valid state. Referring to FIG. 9 to FIG. 11, the decoding circuit 14 may include: three first inverters inv1, where the first inverters inv1 receive the zeroth control signal PerPin<0>, the second control signal PerByte<0>, and the fourth control signal PerByte<2>, respectively, and correspondingly, output the zeroth encoded signal Code0, the second encoded signal Code2, and the fourth encoded signal Code4, respectively; an NOR gate Nor, where two input terminals of the NOR gate Nor receive the third control signal PerByte<1> and the fourth control signal PerByte<2>, respectively, and the NOR gate Nor outputs the third encoded signal Code3; and a logic circuit 141, where three input terminals of the logic circuit 141 receive the first control signal PerPin<1>, the third control signal PerByte<1>, and the fourth control signal PerByte<2>, respectively, and the logic circuit 141 outputs the first encoded signal Code1, where if each of the third control signal PerByte<1> and the fourth control signal PerByte<2> has a logic high level, the first encoded signal Code1 has a logic low level; if at least one of the third control signal PerByte<1> and the fourth control signal PerByte<2> has a logic low level, the first encoded signal Code1 and the first control signal PerPin<1> have opposite levels and phases.

The zeroth encoded signal Code0 is a reverse-phase signal of the zeroth control signal PerPin<0>. The second encoded signal Code2 is a reverse-phase signal of the second control signal PerByte<0>. The fourth encoded signal Code4 is a reverse-phase signal of the fourth control signal PerByte<2>. Correspondingly, the zeroth transistor M00 is obtained based on the first control signal group PerPin<m:0> corresponding to the specific data port, and whether or not the second transistor M02 and the fourth transistor M04 are turned on is controlled based on the second control signal group PerByte<N:0> corresponding to all the data ports.

The first encoded signal Code1 is obtained by compiling the first control signal PerPin<1>, the third control signal PerByte<1>, and the fourth control signal PerByte<2>. Correspondingly, whether or not the first transistor M01 is turned on is jointly controlled based on the first control signal group PerPin<m:0> and the second control signal group PerByte<N:0>. If both the third control signal PerByte<1> and the fourth control signal PerByte<2> have a logic high level, the first transistor M01 is turned on. If at least one of the third control signal PerByte<1> and the fourth control signal PerByte<2> has a logic low level, and the first control signal PerPin<1> has a logic high level, the first transistor M01 is turned on. If at least one of the third control signal PerByte<1> and the fourth control signal PerByte<2> has a logic low level, and the first control signal PerPin<1> has a logic low level, the first transistor M01 is not turned on.

Still referring to FIG. 10, the logic circuit 141 may include: an OR gate 1411, where two input terminals of the OR gate 1411 receive a reverse-phase signal of the third control signal PerByte<1> and a reverse-phase signal of the fourth control signal PerByte<2>, respectively; an NAND gate DEF, where one input terminal of the NAND gate 1412 receives a reverse-phase signal of the first control signal PerPin<1>, and the other input terminal of the NAND gate 1412 is connected to an output terminal of the OR gate 1411; and a second inverter inv2, where an input terminal of the second inverter inv2 is connected to an output terminal of the NAND gate 1412, and an output terminal of the second inverter inv2 outputs the first encoded signal Code1.

The reverse-phase signal of the third control signal PerByte<1> is a third reverse-phase control signal DfeTrim<3>, the reverse-phase signal of the fourth control signal PerByte<2> is a fourth reverse-phase control signal DfeTrim<4>, and the reverse-phase signal of the first control signal PerPin<1> is a first reverse-phase control signal DfePerPin<1>.

Still referring to FIG. 11, the logic circuit 141 may further include: a third inverter inv3, where the third inverter inv3 receives the first control signal PerPin<1> and outputs the reverse-phase signal of the first control signal PerPin<1>, i.e., the first reverse-phase control signal DfePerPin<1>; and two fourth inverters inv4, where the fourth inverters inv4 receive the third control signal PerByte<1> and the fourth control signal PerByte<2>, respectively, and output the reverse-phase signal of the third control signal PerByte<1> and the reverse-phase signal of the fourth control signal PerByte<2>, i.e., output the third reverse-phase control signal DfeTrim<3> and the fourth reverse-phase control signal DfeTrim<4>, respectively.

With the decision feedback equalization circuit 103 described above, the zeroth transistor M00, the first transistor M01, the second transistor M02, the third transistor M03, and the fourth transistor M04 are respectively controlled by different encoded signals to be turned on or off, so that not only the decision feedback equalization function can be disabled, but also the decision feedback equalization adjustment capabilities of seven different magnitudes can be implemented.

Table 1 shows the channel width-to-length ratios of the transistors (i.e., the zeroth to the fourth transistors) corresponding to the zeroth encoded signal to the fourth encoded signal when the first control signal group and the second control signal group have different values, respectively. The zeroth encoded signal to the fourth encoded signal are correspondingly "0", indicating that the transistor is turned off. The zeroth encoded signal to the fourth encoded signal are correspondingly "1", indicating that the transistor having a channel width-to-length ratio n is turned on. The zeroth encoded signal to the fourth encoded signal are correspondingly "2", indicating that the transistor having a channel width-to-length ratio 2n is turned on, and DFE correspondingly indicates an equivalent width-to-length ratio of an equivalent transistor that is obtained through parallel connection of the first adjustment circuit 12 and the second adjustment circuit 13. The equivalent width-to-length ratio is related to an equivalent resistance value. A larger equivalent width-to-length ratio indicates a smaller equivalent resistance value, i.e., a smaller equivalent resistance of an adjustment circuit in the decision feedback equalization circuit 103.

TABLE 1

| PerByte (3 bits) | Code4 | Code3 | Code2 | PerPin (2 bits) | Code1 | Code0 | DFE |
|---|---|---|---|---|---|---|---|
| 000 | 0 | 0 | 0 | 00 | 0 | 0 | 0 |
| 001 | 0 | 0 | 1 | 00 | 0 | 0 | 1 |
| 000 | 0 | 0 | 0 | 01 | 0 | 1 | 1 |
| 001 | 0 | 0 | 1 | 01 | 0 | 1 | 2 |
| 010 | 0 | 2 | 0 | 01 | 0 | 1 | 3 |
| 010 | 0 | 2 | 0 | 10 | 2 | 0 | 4 |
| 011 | 0 | 2 | 1 | 11 | 2 | 1 | 6 |
| 100 | 2 | 2 | 0 | 01 | 0 | 1 | 5 |
| 101 | 2 | 2 | 1 | 10 | 2 | 0 | 7 |
| 110 | 2 | 2 | 0 | 01 | 2 | 1 | 7 |
| 111 | 2 | 2 | 1 | 11 | 2 | 1 | 8 |

It should be noted that in Table 1, Code0 is 0, indicating that the zeroth transistor M00 corresponding to Code0 is turned off, and Code0 is 1, indicating that the zeroth transistor M00 is turned on; Code1 is 0, indicating that the first transistor M01 corresponding to Code1 is turned off, and Code1 is 2, indicating that the first transistor M01 is turned on; Code2 is 0, indicating that the second transistor M02 corresponding to Code2 is turned off, and Code2 is 1, indicating that the second transistor M02 is turned on; Code3 is 0, indicating that the third transistor M03 corresponding to Code3 is turned off, and Code3 is 2, indicating that the third transistor M03 is turned on; Code4 is 0, indicating that the fourth transistor M04 corresponding to Code4 is turned off, and Code4 is 2, indicating that the fourth transistor M04 is turned on; Code5 is 0, indicating that the fifth transistor M05 corresponding to Code5 is turned off, and Code5 is 2, indicating that the fifth transistor M05 is turned on.

In Table 1, the first to the last bits in PerByte (3 bits) are sequentially a fourth control signal PerByte<2>, a third control signal PerByte<1>, and a second control signal PerByte<0>; the first to the last bits in PerPin (2 bits) are sequentially a first control signal PerPin<1> and a zeroth control signal PerPin<0>. DFE is 0, indicating that the decision feedback equalization function is not enabled. When the zeroth control signal to the fourth control signal are all 0, DFE is disabled. DFE is 1, 2, 3, 4, 5, 6, 7, or 8, indicating that the decision feedback equalization function is enabled, and the adjustment circuit may have eight different equivalent transistors, and a ratio of the equivalent channel width-to-length ratios of the eight different equivalent transistors is 1:2:3:4:5:6:7:8. As such, the decision feedback equalization circuit 103 may have different adjustment capabilities for the first output signal and the second output signal. It can be understood that, in addition to disabling the decision feedback equalization function, the decision feedback equalization circuit 103 provided in some embodiments of the present invention further has eight adjustable adjustment capabilities, that is, having one time, two times, three times, four times, five times, six times, seven times, and eight times of the adjustment capability, respectively.

In some examples, each control signal in the first control signal group PerPin<m:0> may be provided by a mode register 70 (Mode Register 70, MR70), a mode register 71 (MR71), a mode register 72 (MR72), or a mode register 73 (MR73). Each control signal in the second control signal group PerByte<N:0> may be provided by a mode register 24 (MR24).

FIG. 12 is a schematic diagram of a structure of an equivalent circuit between a decision enable signal DfeEn and each of a first control signal group PerPin<m:0> and a second control signal group PerByte<N:0> in a decision feedback equalization circuit 103 according to some embodiments of the present invention. If the decision enable signal DfeEn is in a valid state, the decision feedback equalization circuit 103 enables the decision feedback equalization function. If the decision enable signal DfeEn is in an invalid state, the decision feedback equalization circuit 103 does not enable the decision feedback equalization function, that is, DFE is disabled. It can be understood that the decision enable signal DfeEn is an equivalent signal and the data receiving circuit does not need to receive the decision enable signal DfeEn.

In some embodiments, for example, DFE is disabled when the decision enable signal DfeEn is 0. Correspondingly, the equivalent circuit between the decision enable signal DfeEn and each of the first control signal group PerPin<m:0> and the second control signal group PerByte<N:0> includes: a first NOR gate Nor1, where input terminals of the first NOR gate Nor1 respectively receive control signals in the first control signal group PerPin<m:0>, that is, the first control signal PerPin<1> and the zeroth control signal PerPin<0>; a second NOR gate Nor2, where input terminals of the second NOR gate Nor2 respectively receive control signals in the second control signal group PerByte<N:0>, that is, the fourth control signal PerByte<2>, the third control signal PerByte<1>, and the second control signal PerByte<0>; and a second NAND gate 1413, where two input terminals of the second NAND gate 1413 are respectively connected to an output terminal of the first NOR gate Nor1 and an output terminal of the second NOR gate Nor2, and an output terminal of the second NAND gate 1413 outputs the decision enable signal DfeEn.

Referring to FIG. 12, when the fourth control signal PerByte<2>, the third control signal PerByte<1>, the second control signal PerByte<0>, the first control signal PerPin<1>, and the zeroth control signal PerPin<0> are all 0, the decision enable signal DfeEn is 0, that is, is in an invalid state. Correspondingly, the decision feedback equalization circuit 103 does not enable the decision feedback equalization function. This is consistent with the case in which DFE is 0 in Table 1. If at least one of the fourth control signal PerByte<2>, the third control signal PerByte<1>, the second control signal PerByte<0>, the first control signal PerPin<1>, and the zeroth control signal PerPin<0> is 1, the decision enable signal DfeEn is 1, that is, is in a valid state. The decision feedback equalization circuit 103 enables the decision feedback equalization function, and the decision feedback equalization circuit 103 has an adjustable adjustment capability. For an implementation of the adjustable capability, reference may be made to the foregoing description, and details are not described herein again.

Figure 14:
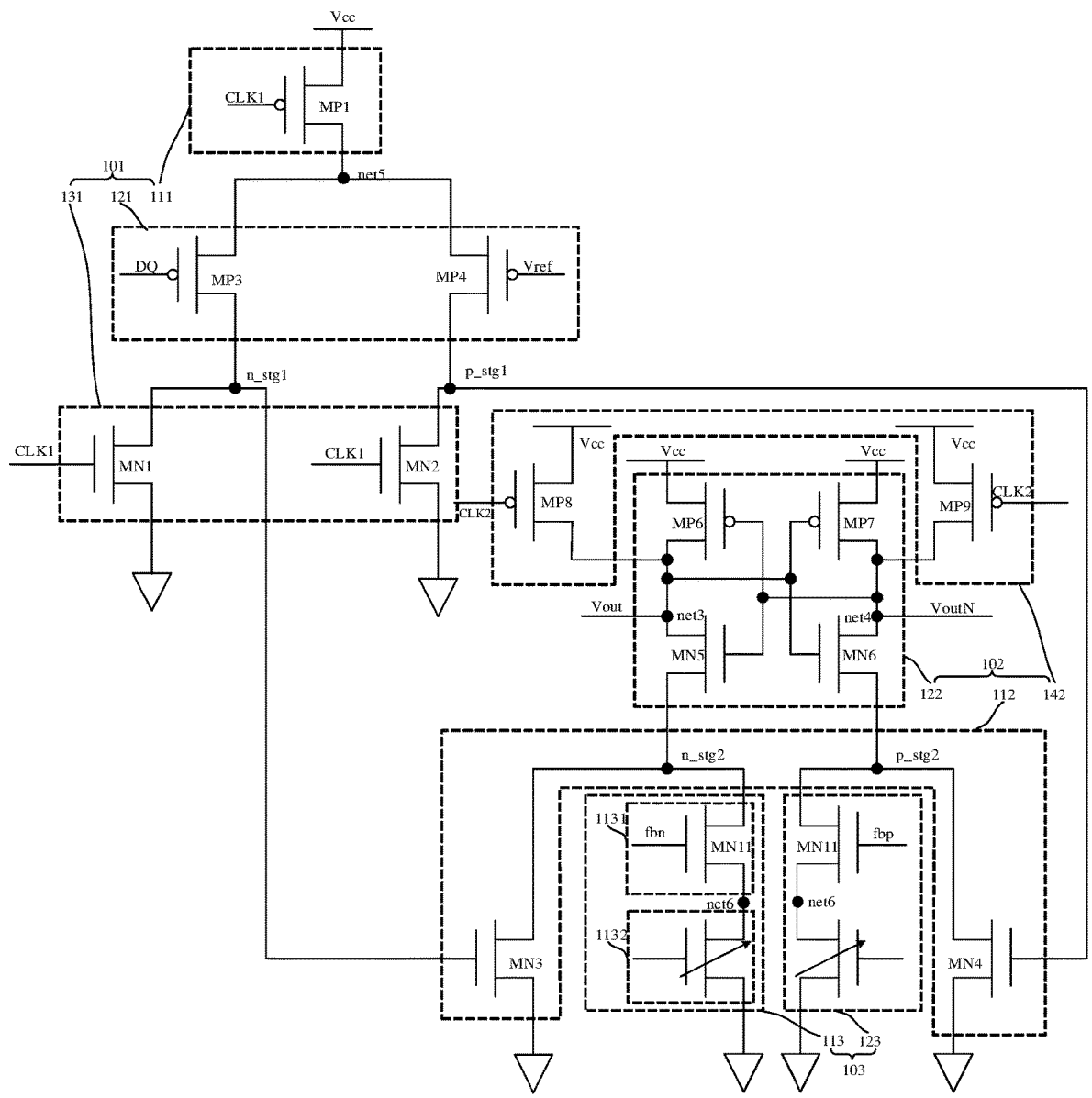

In some other embodiments, referring to FIG. 14, the first internal node n_stg2 serves as a first feedback node and the second internal node p_stg2 serves as a second feedback node. The feedback signal includes a first feedback signal fbn and a second feedback signal fbp. The decision feedback equalization circuit 103 may include: a first decision feedback circuit 113, connected to the first internal node n_stg2 and the ground, and configured to perform decision feedback equalization on the first internal node n_stg2 based on the first feedback signal fbn; and a second decision feedback circuit 123, connected to the second internal node p_stg2 and the ground, and configured to perform decision feedback equalization on the second internal node p_stg2 based on the second feedback signal fbp.

The first decision feedback circuit 113 is configured to adjust a current in the third NMOS transistor MN3 to adjust a voltage at the first internal node n_stg2. The second decision feedback circuit 123 is configured to adjust a current in the fourth NMOS transistor MN4 to adjust a voltage at the second internal node p_stg2.

It should be noted that, when the decision feedback equalization circuit 103 is connected to the first internal node n_stg2 and the second internal node p_stg2 in the second amplifier module 102, the structures of the first decision feedback circuit 113 and the second decision feedback circuit 123 are similar to that shown in FIG. 7, except that the type of the MOS transistor in the switching circuit 1131 varies. For example, when the decision feedback equalization circuit 103 is connected to the first node n_stg1 and the second node p_stg1 in the first amplifier module 101, the MOS transistor in the switching circuit 1131 is a PMOS transistor. When the decision feedback equalization circuit 103 is connected to the first internal node n_stg2 and the second internal node p_stg2 in the second amplifier module 102, the MOS transistor in the switching circuit 1131 is an NMOS transistor. For parts that are the same as or corresponding to the foregoing description, details are not described herein again. The differences between the case in which the decision feedback equalization circuit 103 is connected to the second amplifier module 102 and the case in which the decision feedback equalization circuit 103 is connected to the first amplifier module 101 are described in detail below.

Referring to FIG. 14, either of the first decision feedback circuit 113 and the second decision feedback circuit 123 includes: a switching circuit 1131, configured to turn on the first internal node n_stg2 and the sixth node net6 or the second internal node p_stg2 and the sixth node net6 in response to the feedback signal; and an adjustment circuit 1132, connected between the sixth node net6 and the ground, and configured to adjust a magnitude of an equivalent resistance value between the sixth node net6 and the ground in response to the control signal. In the first decision feedback circuit 113, the feedback signal is the first feedback signal fbn, and the switching circuit 1131 turns on the first internal node n_stg2 and the sixth node net6 in response to the first feedback signal fbn. In the second decision feedback circuit 123, the feedback signal is the second feedback signal fbp, and the switching circuit 1131 turns on the second internal node p_stg2 and the sixth node net6 in response to the second feedback signal fbp.

Still referring to FIG. 14, the switching circuit 1131 may include an eleventh NMOS transistor MN11, connected between the first internal node n_stg2 and the sixth node net6, where a gate of the eleventh NMOS transistor MN11 receives the first feedback signal fbn; or connected between the second internal node p_stg2 and the sixth node net6, where a gate of the eleventh NMOS transistor MN11 receives the second feedback signal fbp. It can be understood that the eleventh NMOS transistor MN11 is equivalent to the fifth PMOS transistor MP5 in FIG. 7.

In some examples, the first feedback signal fbn received by the switching circuit 1131 in the first decision feedback circuit 113 has a low level, and the eleventh NMOS transistor MN11 is turned on. In such case, the adjustment circuit 1132 adjusts the voltage at the first internal node n_stg2 based on the control signal. The second feedback signal fbp received by the switching circuit 1131 in the second decision feedback circuit 123 has a low level, and the eleventh NMOS transistor MN11 is turned on. In such case, the adjustment circuit 1132 adjusts the voltage at the second internal node p_stg2 based on the control signal.

It should be noted that, FIG. 14 shows an example in which the MOS transistor included in the adjustment circuit 1132 is an NMOS transistor. In practice, the structure of the adjustment circuit 1132 is similar to that in the foregoing embodiment, and details are not described herein again.

In some embodiments, referring to FIG. 4 to FIG. 14, the second amplifier module 102 may include: an input circuit 112, connected to the first node n_stg1 and the second node p_stg1, and configured to compare the first voltage signal with the second voltage signal, provide a third voltage signal to a seventh node n_stg2, and provide a fourth voltage signal to an eighth node p_stg2, where the second amplifier module 102 has the first internal node n_stg2 and the second internal node p_stg2, the seventh node n_stg2 serves as the first internal node n_stg2, and the eighth node p_stg2 serves as the second internal node p_stg2; and a latch circuit 122, configured to amplify and latch the third voltage signal and the fourth voltage signal, output the first output signal Vout to the third node net3, and output the second output signal VoutN to the fourth node net4.

The input circuit 112 is configured to compare the first voltage signal with the second voltage signal to output the third voltage signal and the fourth voltage signal. The latch circuit 122 is configured to output a high level signal to the third node net3 and output a low level signal to the fourth node net4, or to output a low level signal to the third node net3 and output a high level signal to the fourth node net4 based on the third voltage signal and the fourth voltage signal.

In some embodiments, referring to FIG. 6, FIG. 13, and FIG. 14, the input circuit 112 may include: a third NMOS transistor MN3, connected between the seventh node n_stg2 and the ground, where a gate of the third NMOS transistor MN3 receives the first voltage signal; and a fourth NMOS transistor MN4, connected between the eighth node p_stg2 and the ground, where a gate of the fourth NMOS transistor MN4 receives the second voltage signal.

In some examples, when a level value of the first voltage signal output by the first node n_stg1 is larger than a level value of the second voltage signal output by the second node p_stg1, a turn-on degree of the third NMOS transistor MN3 is greater than a turn-on degree of the fourth NMOS transistor MN4, so that a voltage at the seventh node n_stg2 is less than a voltage at the eighth node p_stg2. As such, a turn-on degree of the fifth NMOS transistor MN5 is greater than a turn-on degree of the sixth NMOS transistor MN6, and a voltage at the third node net3 is less than a voltage at the fourth node net4. In such case, a turn-on degree of the seventh PMOS transistor MP7 is greater than a turn-on degree of the sixth PMOS transistor MP6, and the latch circuit 122 forms positive feedback amplification, thereby further ensuring that the first output signal Vout output by the third node net3 has a low level and the second output signal VoutN output by the fourth node net4 has a high level.

In some embodiments, still referring to FIG. 6, FIG. 13, and FIG. 14, the latch circuit 122 may include: a fifth NMOS transistor MN5, connected between the seventh node n_stg2 and the third node net3, where a gate of the fifth NMOS transistor MN5 receives the second output signal VoutN; a sixth NMOS transistor MN6, connected between the eighth node p_stg2 and the fourth node net4, where a gate of the sixth NMOS transistor MN6 receives the first output signal Vout; a sixth PMOS transistor MP6, connected between the power supply node Vcc and the third node net3, where a gate of the sixth PMOS transistor MP6 receives the second output signal VoutN; and a seventh PMOS transistor MP7, connected between the power supply node Vcc and the fourth node net4, where a gate of the seventh PMOS transistor MP7 receives the first output signal Vout.

In some embodiments, referring to FIG. 4, the second amplifier module 102 may further include a second resetting circuit 142, connected to the latch circuit 122 and configured to reset the latch circuit 122. As such, after completing the reception of the data signal DQ and the reference signal Vref and the output of the first output signal Vout and the second output signal VoutN for one time, the data receiving circuit may restore the level values at the third node net3 and the fourth node net4 to initial values by using the second resetting circuit 142, thereby facilitating next data reception and processing by the data receiving circuit later.

In some embodiments, still referring to FIG. 6, FIG. 13, and FIG. 14, the second resetting circuit 142 may include: an eighth PMOS transistor MP8, connected between the power supply node Vcc and the third node net3; and a ninth PMOS transistor MP9, connected between the power supply node Vcc and the fourth node net4, where both a gate of the eighth PMOS transistor MP8 and a gate of the ninth PMOS transistor MP9 respond to the reverse-phase signal CLK2 of the sampling clock signal CLK1.

In some examples, when the sampling clock signal CLK1 and the enable signal SampEnN have a low level, both the first PMOS transistor MP1 and the second PMOS transistor MP2 are turned on. In such case, both the first NMOS transistor MN1 and the second NMOS transistor MN2 are turned off, the reverse-phase signal CLK2 of the sampling clock signal CLK1 has a high level, and both the eighth PMOS transistor MP8 and the ninth PMOS transistor MP9 are turned off to ensure normal operation of the data receiving circuit. When the sampling clock signal CLK1 has a high level, the first PMOS transistor MP1 is turned off. In such case, both the first NMOS transistor MN1 and the second NMOS transistor MN2 are turned on, the reverse-phase signal CLK2 of the sampling clock signal CLK1 has a low level, and both the eighth PMOS transistor MP8 and the ninth PMOS transistor MP9 are turned on to pull up the voltage at the third node net3 and the voltage at the fourth node net4, thereby resetting the third node net3 and the fourth node net4.

In some embodiments, referring to FIG. 13, on the basis of including the eighth PMOS transistor MP8 and the ninth PMOS transistor MP9, the second resetting circuit 142 may further include: a tenth PMOS transistor MP10, connected between the power supply node Vcc and the seventh node n_stg2; and an eleventh PMOS transistor MP11, connected between the power supply node Vcc and the eighth node p_stg2, where both a gate of the tenth PMOS transistor MP10 and a gate of the eleventh PMOS transistor MP11 respond to the reverse-phase signal CLK2 of the sampling clock signal CLK1. As such, when the data receiving circuit does not need to receive the data signal DQ and the reference signal Vref, it is conducive to further ensuring that the voltage at the third node net3 and the voltage at the fourth node net4 are pulled up, thereby resetting the third node net3 and the fourth node net4.

A connection relationship between the offset compensation circuit 104 and the second amplifier module 102 is described in detail below.

In some embodiments, referring to FIG. 6, the first node n_stg1 serves as a first feedback node and the second node p_stg1 serves as a second feedback node. The data receiving circuit may further include: an offset compensation circuit 104, connected to the seventh node n_stg2 and the eighth node p_stg2, and configured to compensate an offset voltage of the input circuit 112.

In some embodiments, referring to FIG. 6, the offset compensation circuit 104 may include: a first offset compensation circuit 114, connected between the seventh node n_stg2 and the ground; and a second offset compensation circuit 124, connected between the eighth node p_stg2 and the ground. The first offset compensation circuit 114 is configured to compensate a parameter of the third NMOS transistor MN3. The second offset compensation circuit 124 is configured to compensate a parameter of the fourth NMOS transistor MN4. The first offset compensation circuit 114 and the second offset compensation circuit 124 can adjust the offset voltage of the data receiving circuit by compensating the parameters of the third NMOS transistor MN3 and the fourth NMOS transistor MN4.

In some embodiments, referring to FIG. 6, the first offset compensation circuit 114 may include at least two transistor groups that are connected in parallel. Each transistor group includes: a seventh NMOS transistor MN7, where a first terminal of the seventh NMOS transistor MN7 is connected to the seventh node n_stg2, and a gate of the seventh NMOS transistor MN7 is connected to the first node n_stg1; and a seventh MOS transistor M7, where the seventh MOS transistor M7 is disposed in a one-to-one correspondence with the seventh NMOS transistor MN7, the seventh MOS transistor M7 is connected between a second terminal of the seventh NMOS transistor MN7 and the ground, and a gate of the seventh MOS transistor M7 receives a first mismatch adjustment signal Offset_1. It should be noted that, for simplicity of illustration, FIG. 6 shows one transistor group in the first offset compensation circuit 114.

As such, a turn-on degree of the seventh NMOS transistor MN7 can be controlled using the first mismatch adjustment signal Offset_1, so as to adjust an overall equivalent resistance of the first offset compensation circuit 114, thereby further adjusting the voltage at the seventh node n_stg2.

In some embodiments, referring to FIG. 6, the second offset compensation circuit 124 may include at least two transistor groups that are connected in parallel. Each transistor group includes: an eighth NMOS transistor MN8, where a first terminal of the eighth NMOS transistor MN8 is connected to the eighth node p_stg2, and a gate of the eighth NMOS transistor MN8 is connected to the second node p_stg1; and an eighth MOS transistor M8, where the eighth MOS transistor M8 is disposed in a one-to-one correspondence with the eighth NMOS transistor MN8, the eighth MOS transistor M8 is connected between a second terminal of the eighth NMOS transistor MN8 and the ground, and a gate of the eighth MOS transistor M8 receives a second mismatch adjustment signal Offset_2. It should be noted that, for simplicity of illustration, FIG. 6 shows one transistor group in the second offset compensation circuit 124.

As such, a turn-on degree of the eighth NMOS transistor MN8 can be controlled using the second mismatch adjustment signal Offset_2, so as to adjust an overall equivalent resistance of the second offset compensation circuit 124, thereby further adjusting the voltage at the eighth node p_stg2.

A connection relationship between the offset compensation circuit 104 and the first amplifier module 101 is described in detail below.

In some embodiments, the seventh node n_stg2 serves as a first feedback node and the eighth node p_stg2 serves as a second feedback node. The data receiving circuit may further include an offset compensation circuit 104, connected to the first node n_stg1 and the second node p_stg1, and configured to compensate an offset voltage of the comparison circuit 121.

The offset compensation circuit 104 may include: a first offset compensation circuit 114, connected between the fifth node net5 and the first node n_stg1; and a second offset compensation circuit 124, connected between the fifth node net5 and the second node p_stg1. The first offset compensation circuit 114 is configured to compensate a parameter of the third PMOS transistor MP3. The second offset compensation circuit 124 is configured to compensate a parameter of the fourth PMOS transistor MP4. The first offset compensation circuit 114 and the second offset compensation circuit 124 can adjust the offset voltage of the data receiving circuit by compensating the parameters of the third PMOS transistor MP3 and the fourth PMOS transistor MP4.

In some embodiments, referring to FIG. 13, the data receiving circuit may further include a thirteenth MOS transistor M1, where a gate of the thirteenth MOS transistor M1 receives the sampling clock signal CLK1, a drain of the thirteenth MOS transistor M1 is connected to the fifth node net5, and a source of the thirteenth MOS transistor M1 is connected to the ground.

In conclusion, the decision feedback equalization circuit 103 is integrated into the data receiving circuit, allowing adjustment of a signal output by the data receiving circuit by using a smaller circuit layout area and with lower power consumption. In addition, the capability of the decision feedback equalization circuit 103 provided in some embodiments of the present invention to adjust the first output signal Vout and the second output signal VoutN is adjustable. It can be understood that, when the data signal DQ and/or the reference signal Vref received by the receive circuit 100 changes, the capability of the decision feedback equalization circuit 103 to adjust the first output signal Vout and the second output signal VoutN can be flexibly controlled to reduce inter-symbol interference in the data receiving circuit, thereby improving the receiving performance of the data receiving circuit. In addition, the decision feedback equalization circuit 103 may change the adjustment capability based on the first control signal group and the second control signal group, the first control signal group corresponds to one data port connected to the data receiving circuit, and the second control signal group corresponds to all the data ports, so that the adjustment capability of the decision feedback equalization circuit 103 has a wider variable range, thereby further improving a capability of alleviating inter-symbol interference.

Figure 2:
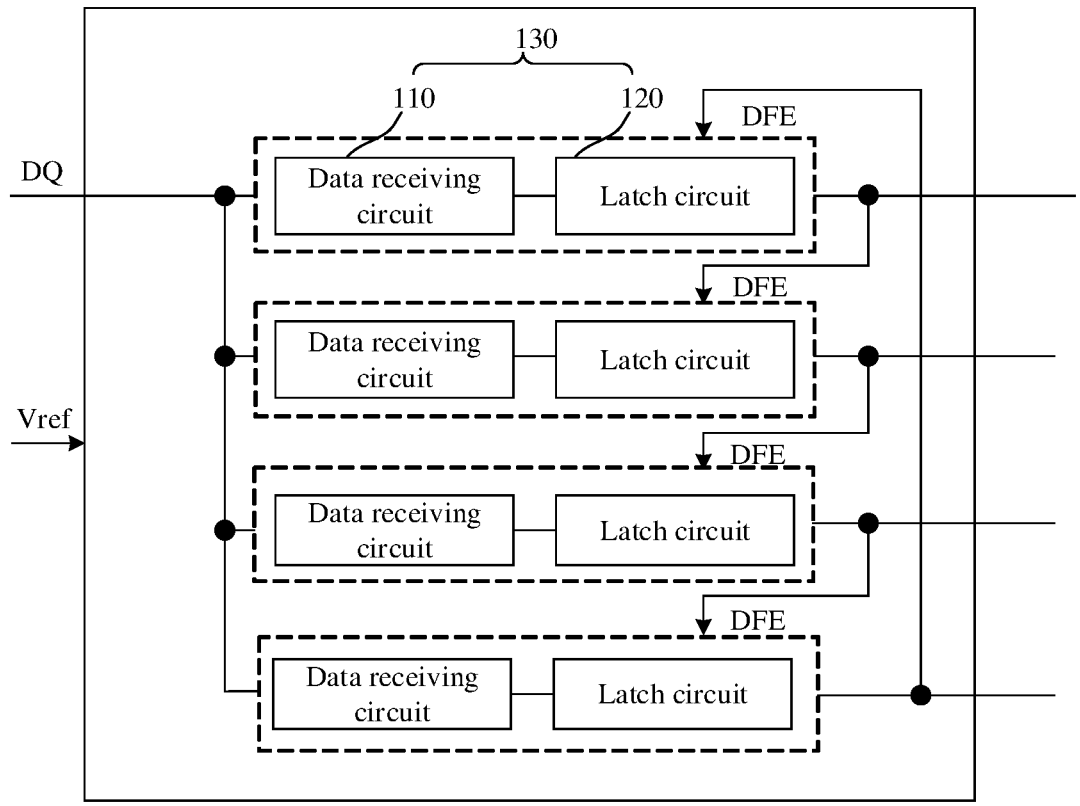
FIG. 2 is a block diagram of a data receiving system according to some embodiments of the present invention.

Some other embodiments of the present invention further provide a data receiving system, and the data receiving system provided in some other embodiments of the present invention is described in detail below with reference to the accompanying drawings. FIG. 2 is a functional block diagram of a data receiving system according to some other embodiments of the present invention.

Referring to FIG. 2, the data receiving system includes: a plurality of cascaded data transmission circuits 130, where each of the data transmission circuits 130 includes the data receiving circuit 110 described in some embodiments of the present invention and a latch circuit 120 connected to the data receiving circuit 110, and each of the data receiving circuits 110 is connected to a data port to receive a data signal DQ; a data transmission circuit 130 at a current stage is connected to a decision feedback equalization circuit DFE of a data transmission circuit 130 at a next stage, and an output of the data transmission circuit 130 at the current stage is used as a feedback signal of the decision feedback equalization circuit DFE of the data transmission circuit 130 at the next stage; a data transmission circuit 130 at a last stage is connected to a decision feedback equalization circuit DFE of a data transmission circuit 130 at a first stage, and an output of the data transmission circuit 130 at the last stage is used as a feedback signal of the decision feedback equalization circuit DFE of the data transmission circuit 130 at the first stage.

The latch circuit 120 is disposed in a one-to-one correspondence with the data receiving circuit 110, and is configured to latch and output a signal output by the data receiving circuit 110 corresponding to the latch circuit 120.

It should be noted that the output of any one of the data transmission circuits 130 may include the following two cases: In some embodiments, the output of the data transmission circuit 130 refers to the output of the data receiving circuit 110. It can be understood that an output of a data receiving circuit 110 at a current stage is used as a feedback signal of a decision feedback equalization circuit DFE of a data receiving system at a next stage, and an output of a data receiving circuit 110 at a last stage is used as a feedback signal of a decision feedback equalization circuit DFE of a data receiving system at a first stage. As such, the output of the data receiving circuit 110 is directly transmitted to the decision feedback equalization circuit DFE without passing through the latch circuit 120, thereby reducing a data transmission delay. In some other embodiments, the output of the data transmission circuit 130 refers to the output of the latch circuit 120. It can be understood that an output of a data receiving circuit 110 at a current stage is latched by a latch circuit 120 corresponding to the data receiving circuit 110 at the current stage, and then is connected to a decision feedback equalization circuit DFE of a data receiving system at a next stage via an output terminal of the latch circuit 120. Further, an output of a latch circuit 120 at a current stage is used as a feedback signal of a decision feedback equalization circuit DFE of a data receiving system at a next stage, and an output of a latch circuit 120 at a last stage is used as a feedback signal of a decision feedback equalization circuit DFE of a data receiving system at a first stage.

It should be noted that, FIG. 1 shows an example in which the data receiving system includes four cascaded data receiving circuits 110, and a phase difference between sampling clock signals of data receiving circuits 110 at adjacent stages is 90°. In practice, a quantity of cascaded data receiving circuits 110 included in the data receiving system is not limited, and the phase difference between the sampling clock signals of the data receiving circuits 110 at the adjacent stages may be properly set based on the quantity of cascaded data receiving circuits 110.

In some embodiments, the phase difference between the sampling clock signals of the data receiving circuits 110 at the adjacent stages is 90°, and a period of the sampling clock signal is twice a period of the data signal DQ received by the data port. As such, clock wiring is facilitated and power consumption is reduced.

In conclusion, the data receiving system according to some other embodiments of the present invention can flexibly control the capability to adjust the first output signal Vout and the second output signal VoutN, so as to reduce impact of inter-symbol interference of data received by the data receiving circuit 110 on the data receiving circuit 110, thereby improving the receiving performance of the data receiving circuit 110, reducing impact of the inter-symbol interference of the data on accuracy of the signal output by the data receiving circuit 110, and improving the receiving performance of the data receiving system.

Still some other embodiments of the present invention further provide a storage apparatus, including: a plurality of data ports; and a plurality of the data receiving systems according to some other embodiments of the present invention, where each of the data receiving systems corresponds to one of the data ports. As such, each data port in the storage apparatus can flexibly control the received data signal DQ by using the data receiving system, and improve the capability to adjust the first output signal Vout and the second output signal VoutN, thereby improving the receiving performance of the storage apparatus.

In some embodiments, the storage apparatus may be a DDR memory, such as a DDR4 memory, a DDR5 memory, a DDR6 memory, an LPDDR4 memory, an LPDDR5 memory, or an LPDDR6 memory. A person of ordinary skill in the art can understand that the above-mentioned implementations are some specific embodiments for implementing the present invention. In practice, various form and detail changes can be made to the implementations of the present invention without departing from the spirit and scope of the present invention. Any person skilled in the art can make changes and modifications without departing from the spirit and scope of the present invention. Therefore, the protection scope of the present invention shall be defined by the claims.

What is claimed is:

1. A data receiving circuit, comprising:
a receive circuit, configured to receive a data signal from one of data ports and a reference signal, compare the data signal with the reference signal in response to a sampling clock signal, and output a first output signal and a second output signal; and
a decision feedback equalization circuit, connected to a feedback node of the receive circuit and configured to perform decision feedback equalization on the receive circuit based on a feedback signal to adjust the first output signal and the second output signal, wherein the feedback signal is obtained based on previously received data, the decision feedback equalization circuit responds to a first control signal group and a second control signal group to adjust a capability to adjust the first output signal and the second output signal, the first control signal group corresponds to one of the data ports corresponding to the data signal, and the second control signal group corresponds to all of the data ports, wherein the decision feedback equalization circuit comprises:
a first adjustment circuit, configured to adjust an equivalent resistance value of the first adjustment circuit in response to a first encoded signal group, wherein the equivalent resistance value of the first adjustment circuit is denoted as a first resistance value, and the first encoded signal group is obtained by performing first compilation on the first control signal group and/or the second control signal group; and
a second adjustment circuit, connected in parallel to the first adjustment circuit and configured to adjust an equivalent resistance value of the second adjustment circuit in response to a second encoded signal group, wherein the equivalent resistance value of the second adjustment circuit is denoted as a second resistance value, and the second encoded signal group is obtained by performing second compilation on the first control signal group or the second control signal group,
wherein an equivalent resistance value of the first adjustment circuit and the second adjustment circuit is related to a capability of the decision feedback equalization circuit to adjust the first output signal and the second output signal.

2. The data receiving circuit according to claim 1, wherein the first encoded signal group comprises a zeroth encoded signal and a first encoded signal, and the first adjustment circuit comprises:
   a zeroth transistor and a first transistor that are connected in parallel, wherein a channel width-to-length ratio of the zeroth transistor is n, a channel width-to-length ratio of the first transistor is 2n, and a gate of the zeroth transistor and a gate of the first transistor receive the zeroth encoded signal and the first encoded signal, respectively;
   the second encoded signal group comprises a second encoded signal, a third encoded signal, and a fourth encoded signal, and the second adjustment circuit comprises:
   a second transistor, a third transistor, and a fourth transistor that are connected in parallel, wherein a channel width-to-length ratio of the second transistor is n, a channel width-to-length ratio of the third transistor is 2n, a channel width-to-length ratio of the fourth transistor is 2n, and a gate of the second transistor, a gate of the third transistor, and a gate of the fourth transistor receive the second encoded signal, the third encoded signal, and the fourth encoded signal, respectively, wherein n is an integer greater than or equal to 1.

3. The data receiving circuit according to claim 2, wherein the decision feedback equalization circuit further comprises:
   a decoding circuit, configured to perform a logical operation on the first control signal group and the second control signal group to obtain the first encoded signal group and the second encoded signal group.

4. The data receiving circuit according to claim 3, wherein the decoding circuit is configured to control: if data of the most significant bit in the second control signal group is 1, the third encoded signal and the fourth encoded signal to be in a valid state, wherein the third transistor is turned on in response to the third encoded signal in the valid state, and the fourth transistor is turned on in response to the fourth encoded signal in the valid state.

5. The data receiving circuit according to claim 3, wherein the decoding circuit is configured to control: if data of each of two most significant bits in the second control signal group is 1, the first encoded signal to be in a valid state; or if data of the most significant bit in the first control signal group is 1, the first encoded signal to be in a valid state, wherein the first transistor is turned on in response to the first encoded signal in the valid state.

6. The data receiving circuit according to claim 3, wherein the first control signal group comprises a zeroth control signal and a first control signal; the second control signal group comprises a second control signal, a third control signal, and a fourth control signal; the decoding circuit comprises:
   three first inverters, wherein the first inverters are configured to receive the zeroth control signal, the second control signal, and the fourth control signal, respectively, and correspondingly, output the zeroth encoded signal, the second encoded signal, and the fourth encoded signal, respectively;
   an NOR gate, wherein two input terminals of the NOR gate receive the third control signal and the fourth control signal, respectively, and the NOR gate outputs the third encoded signal; and
   a logic circuit, wherein three input terminals of the logic circuit receive the first control signal, the third control signal, and the fourth control signal, respectively, and the logic circuit outputs the first encoded signal, wherein
   if each of the third control signal and the fourth control signal has a logic high level, the first encoded signal has a logic low level; if at least one of the third control signal and the fourth control signal has a logic low level, the first encoded signal and the first control signal have opposite levels and phases.

7. The data receiving circuit according to claim 6, wherein the logic circuit comprises:
   an OR gate, wherein two input terminals of the OR gate receive a reverse-phase signal of the third control signal and a reverse-phase signal of the fourth control signal, respectively;
   an NAND gate, wherein a first input terminal of the NAND gate receives a reverse-phase signal of the first control signal, and a second input terminal of the NAND gate is connected to an output terminal of the OR gate; and
   a second inverter, wherein an input terminal of the second inverter is connected to an output terminal of the NAND gate, and an output terminal of the second inverter outputs the first encoded signal.

8. The data receiving circuit according to claim 7, wherein the logic circuit further comprises:
   a third inverter, wherein the third inverter receives the first control signal and outputs the reverse-phase signal of the first control signal; and
   two fourth inverters, wherein the fourth inverters receive the third control signal and the fourth control signal, respectively, and output the reverse-phase signal of the third control signal and the reverse-phase signal of the fourth control signal, respectively.

9. The data receiving circuit according to claim 1, wherein the receive circuit comprises:
   a first amplifier module, configured to receive the data signal and the reference signal, compare the data signal with the reference signal in response to the sampling clock signal, output a first voltage signal through a first node, and output a second voltage signal through a second node; and
   a second amplifier module, connected to the first node and the second node and configured to perform amplification processing on a voltage difference between the first voltage signal and the second voltage signal, output the first output signal through a third node, and output the second output signal through a fourth node, wherein
   the feedback node comprises a first feedback node and a second feedback node, the first node serves as the first feedback node, the second node serves as the second feedback node, and the decision feedback equalization circuit is configured to perform the decision feedback equalization on the first node and the second node based on the feedback signal to adjust the first voltage signal and the second voltage signal.

10. The data receiving circuit according to claim 9, further comprising an offset compensation circuit, connected to the second amplifier module and configured to compensate an offset voltage of the second amplifier module.

11. The data receiving circuit according to claim 1, wherein the receive circuit comprises:
   a first amplifier module, configured to receive the data signal and the reference signal, compare the data signal with the reference signal in response to the sampling clock signal, output a first voltage signal through a first node, and output a second voltage signal through a second node; and a second amplifier module, connected to the first node and the second node and configured to perform amplification processing on a voltage difference between the first voltage signal and the second voltage signal, output the first output signal through a third node, and output the second output signal through a fourth node, wherein the second amplifier module has a first internal node and a second internal node, and the first output signal and the second output signal are obtained based on a signal of the first internal node and a signal of the second internal node;

the feedback node comprises a first feedback node and a second feedback node, the first internal node serves as the first feedback node, the second internal node serves as the second feedback node, and the decision feedback equalization circuit is configured to perform the decision feedback equalization on the first internal node and the second internal node based on the feedback signal.

12. The data receiving circuit according to claim 11, further comprising an offset compensation circuit, connected to the first amplifier module and configured to compensate an offset voltage of the first amplifier module.

13. The data receiving circuit according to claim 9, wherein the first amplifier module comprises:
a current source, configured to be connected between a power supply node and a fifth node to supply a current to the fifth node in response to the sampling clock signal; and
a comparison circuit, connected to the fifth node, the first node, and the second node, and configured to: receive the data signal and the reference signal, and when the current source supplies the current to the fifth node in response to the sampling clock signal, compare the data signal with the reference signal, output the first voltage signal through the first node, and output the second voltage signal through the second node.

14. The data receiving circuit according to claim 13, wherein the first amplifier module further comprises:
a first resetting circuit, connected to the first node and the second node, and configured to reset the first node and the second node.

15. The data receiving circuit according to claim 11, wherein the second amplifier module comprises:

an input circuit, connected to the first node and the second node, and configured to compare the first voltage signal with the second voltage signal, provide a third voltage signal to a seventh node, and provide a fourth voltage signal to an eighth node, wherein the second amplifier module has the first internal node and the second internal node, the seventh node serves as the first internal node, and the eighth node serves as the second internal node; and a latch circuit, configured to amplify and latch the third voltage signal and the fourth voltage signal, output the first output signal to the third node, and output the second output signal to the fourth node.

16. The data receiving circuit according to claim 15, wherein the second amplifier module comprises: a second resetting circuit, connected to the latch circuit and configured to reset the latch circuit.

17. The data receiving circuit according to claim 11, wherein the data receiving circuit includes no adder.

18. A data receiving system, comprising:
a plurality of cascaded data transmission circuits, wherein each of the data transmission circuits comprises the data receiving circuit according to claim 1 and a latch circuit connected to the data receiving circuit, and each of the data receiving circuits is connected to a data port to receive a data signal; a data transmission circuit at a current stage is connected to a decision feedback equalization circuit of a data transmission circuit at a next stage, and an output of the data transmission circuit at the current stage is used as a feedback signal of the decision feedback equalization circuit of the data transmission circuit at the next stage;
a data transmission circuit at a last stage is connected to a decision feedback equalization circuit of a data transmission circuit at a first stage, and an output of the data transmission circuit at the last stage is used as a feedback signal of the decision feedback equalization circuit of the data transmission circuit at the first stage.

19. A storage apparatus, comprising:
a plurality of data ports; and
a plurality of the data receiving systems, wherein each of the data receiving systems comprises the data receiving system according to claim 18, wherein each of the data receiving systems corresponds to one of the data ports.

* * * * *